United States Patent
Komura et al.

(10) Patent No.: US 7,838,331 B2
(45) Date of Patent: Nov. 23, 2010

(54) METHOD FOR DICING SEMICONDUCTOR SUBSTRATE

(75) Inventors: Atsushi Komura, Kariya (JP); Tetsuo Fujii, Toyohashi (JP); Muneo Tamura, Nagoya (JP); Makoto Asai, Kariya (JP)

(73) Assignee: Denso Corporation, Kariya (JP)

( * ) Notice: Subject to any disclaimer, the term of this patent is extended or adjusted under 35 U.S.C. 154(b) by 785 days.

(21) Appl. No.: 11/598,654

(22) Filed: Nov. 14, 2006

(65) Prior Publication Data

US 2007/0111390 A1 May 17, 2007

(30) Foreign Application Priority Data

| Nov. 16, 2005 | (JP) | 2005-331208 |
| Nov. 16, 2005 | (JP) | 2005-331210 |
| Jun. 23, 2006 | (JP) | 2006-173649 |
| Oct. 24, 2006 | (JP) | 2006-288743 |

(51) Int. Cl.
H01L 21/00 (2006.01)

(52) U.S. Cl. .............. 438/106; 438/108; 438/110; 438/462; 438/464; 257/E21.218; 257/E21.508; 257/E21.599; 257/E23.004; 257/E23.067

(58) Field of Classification Search ......... 438/113–115, 438/460–465
See application file for complete search history.

(56) References Cited

U.S. PATENT DOCUMENTS

| 3,838,501 | A | * | 10/1974 | Umbaugh | 438/113 |
| 6,063,695 | A | * | 5/2000 | Lin et al. | 438/462 |
| 6,214,703 | B1 | * | 4/2001 | Chen et al. | 438/462 |
| 6,429,506 | B1 | * | 8/2002 | Fujii et al. | 257/620 |
| 6,551,863 | B2 | * | 4/2003 | Johnson et al. | 438/127 |
| 6,992,026 | B2 | | 1/2006 | Fukuyo et al. | |
| 7,067,901 | B2 | * | 6/2006 | Farnworth et al. | 257/620 |
| 7,071,012 | B2 | * | 7/2006 | Tan et al. | 438/14 |
| 7,071,024 | B2 | * | 7/2006 | Towle et al. | 438/106 |
| 7,087,460 | B2 | * | 8/2006 | Lee | 438/110 |
| 7,129,114 | B2 | * | 10/2006 | Akram | 438/110 |
| 7,335,576 | B2 | * | 2/2008 | David et al. | 438/462 |
| 7,396,742 | B2 | * | 7/2008 | Fukuyo et al. | 438/463 |

(Continued)

FOREIGN PATENT DOCUMENTS

EP  1 742 253 A1  3/2005

(Continued)

OTHER PUBLICATIONS

Office Action dated Mar. 10, 2008 in corresponding German Patent Application No. 10 2006 054 073.5 (and English translation).

(Continued)

*Primary Examiner*—Michael S Lebentritt
(74) *Attorney, Agent, or Firm*—Posz Law Group, PLC

(57) ABSTRACT

A device separated from a wafer includes: a chip having a sidewall, which is provided by a dicing surface of the wafer in a case where the device is separated from the wafer; and a protection member disposed on the sidewall of the chip for protecting the chip from being contaminated by a dust from the dicing surface. In the device, the dicing surface of the wafer is covered with the protection member so that the chip is prevented from contaminated with the dust.

14 Claims, 22 Drawing Sheets

U.S. PATENT DOCUMENTS

| | | |
|---|---|---|
| 7,435,607 B2 * | 10/2008 | Nagai ............................ 438/33 |
| 7,449,396 B2 * | 11/2008 | Murata et al. ................ 438/463 |
| 2004/0226927 A1 | 11/2004 | Morikazu et al. |
| 2005/0173387 A1 | 8/2005 | Fukuyo et al. |
| 2005/0181581 A1 | 8/2005 | Fukuyo et al. |
| 2005/0184037 A1 | 8/2005 | Fukuyo et al. |
| 2005/0189330 A1 | 9/2005 | Fukuyo et al. |
| 2005/0194364 A1 | 9/2005 | Fukuyo et al. |
| 2005/0202596 A1 | 9/2005 | Fukuyo et al. |
| 2005/0202651 A1 | 9/2005 | Akram |
| 2006/0011593 A1 | 1/2006 | Fukuyo et al. |
| 2006/0040473 A1 | 2/2006 | Fukuyo et al. |
| 2006/0160331 A1 | 7/2006 | Fukuyo et al. |

FOREIGN PATENT DOCUMENTS

| | | |
|---|---|---|
| EP | 1-575-081 | 9/2005 |
| JP | A-48-52375 | 7/1973 |
| JP | A-50-37347 | 4/1975 |
| JP | A-62-063446 | 3/1987 |
| JP | A-05-283450 | 10/1993 |
| JP | A-06-005665 | 1/1994 |
| JP | A-6-77316 | 3/1994 |
| JP | A-07-321070 | 12/1995 |
| JP | A-2000-124163 | 4/2000 |
| JP | 2003-068832 | 3/2003 |
| JP | A-2004-128115 | 4/2004 |
| WO | WO 2005/098916 | * 10/2005 |

OTHER PUBLICATIONS

Notice of Reason for Refusal mailed on January 26, 2010 in the corresponding Japanese patent application No. 2005-331210 (and English translation).

* cited by examiner

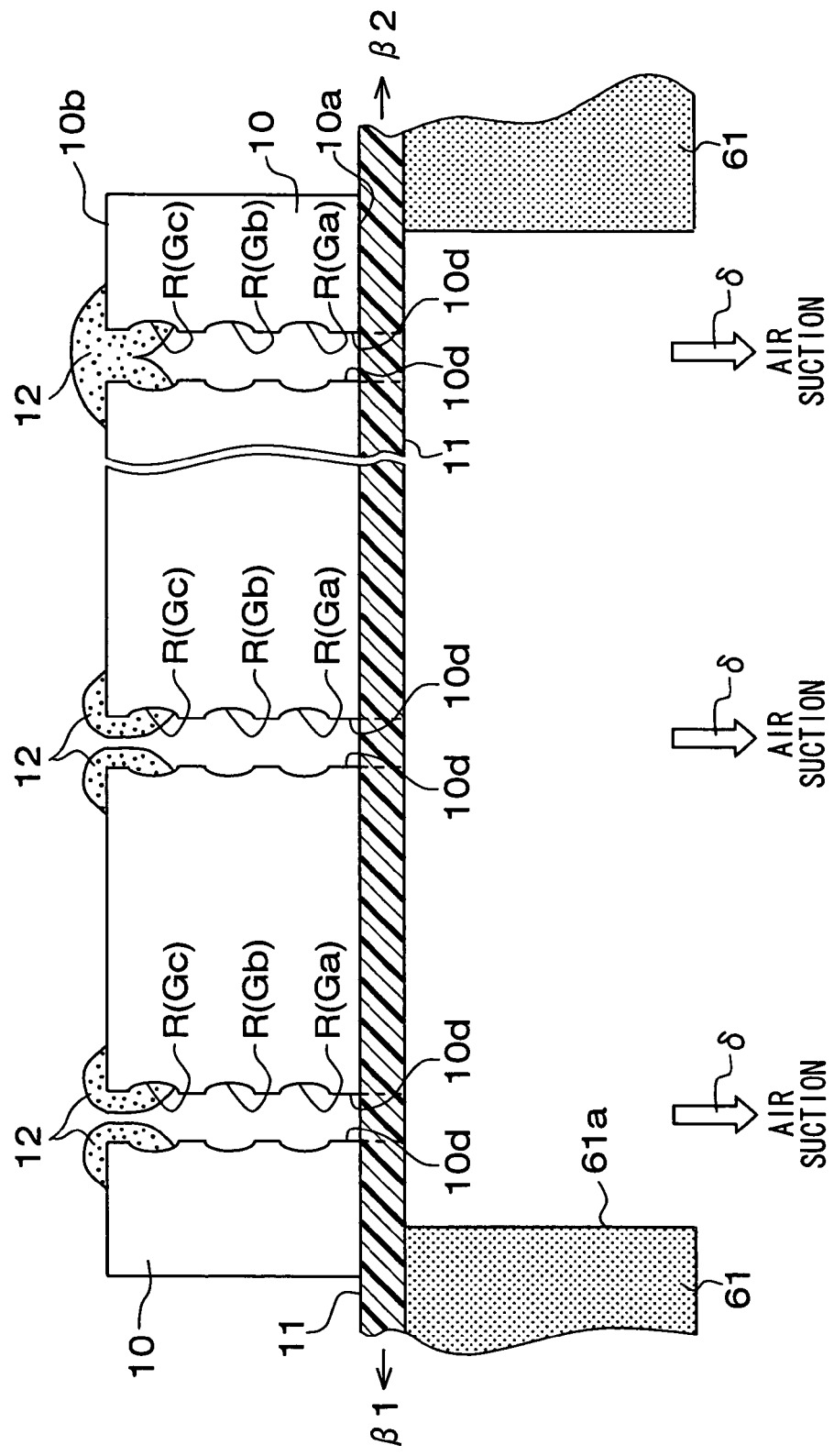

METHOD FOR DICING SEMICONDUCTOR SUBSTRATE

CROSS REFERENCE TO RELATED APPLICATIONS

This application is based on Japanese Patent Applications No. 2005-331208 filed on Nov. 16, 2005, No. 2005-331210 filed on Nov. 16, 2005, No. 2006-173649 filed on Jun. 23, 2006, and No. 2006-288743 filed on Oct. 24, 2006, the disclosures of which are incorporated herein by reference.

FIELD OF THE INVENTION

The present invention relates to a semiconductor device and a method for processing a wafer.

BACKGROUND OF THE INVENTION

Conventionally, a processing object such as a semiconductor wafer is diced, i.e., cut and separated, by using a laser beam. This laser dicing method is disclosed in, for example, Japanese Patent No. 3408805. In this method, the laser beam is irradiated on the processing object such as a wafer to focus on the inside of the object. Thus, a reforming portion is formed in the inside of the object by multiple photon absorption effect of the laser beam. The reforming portion includes a crack, a melting region, or a region, of which a refractive index is changed. The reforming portion provides a starting point of dicing, which is formed along with a dicing line of the object and disposed inside of the object apart from the surface of the object by a predetermined distance. The laser beam is irradiated on the surface of the object. The object is diced from the starting point.

Further, another technique is disclosed in, for example, JP-A-2002-205180. In this technique, a laser beam is irradiated on a processing object to focus on the inside of the object. A reforming portion is formed in the inside of the object along with a cutting line of the object. Further, the focus point of the laser beam in an incident direction of the laser beam is changed, so that multiple reforming portions are formed in the object along with the incident direction. In this technique, multiple starting points are formed. Accordingly, when the thickness of the object is large, the object can be diced easily.

Furthermore, another method for dicing an object is disclosed in, for example, JP-A-2005-1001. In the method, an extensible film is formed on one side of the object having a plate shape such as a substrate. The other side of the object is a laser beam incident surface. The laser beam is irradiated on the other side of the object to focus on the inside of the object. Thus, the reforming portion is formed so that the staring point of dicing is provided by the reforming portion along with a cutting line of the object. The starting point is disposed inside of the object from the laser beam incident surface by a predetermined distance. Then, the film is extended so that the object is separated and cut from the starting point. Thus, the object is divided into multiple chips. Since the film is extended when the object is diced, an appropriate tensile stress is applied around the starting point. Accordingly, the object is cut accurately with a comparative small force.

In the above methods, when the object is cut from the reforming portion as a starting point, or after the object is cut, a particle such as a small flake may be removed from a cutting surface, i.e., a dicing surface. The particle is formed from a component of the object. The particle generates a dust.

When the dust is attached to a semiconductor device formed on a chip, the semiconductor device may malfunction. Accordingly, a yielding ratio of the chip is reduced, and further, quality of the chip is also reduced.

For example, in a case where a monolithic IC as a semiconductor device is formed on the chip, when the particle is attached on the semiconductor element or a wiring in the monolithic IC, the particle may cause short-circuit.

In a case where a sensor such as a pressure sensor, an acceleration sensor and a supersonic sensor composed of a piezo-electric element and/or a capacitor or a micro-machine is formed on the chip by using a micro electro mechanical system method (i.e., MEMS method), when the particle is attached on a movable portion composing the sensor or the micro machine, the particle may prevent the movable portion from displacing. Thus, performance such as sensitivity in the sensor or the micro machine is reduced.

A dicing film, i.e., a dicing sheet, is disclosed in, for example, JP-A-2003-10986. The dicing film is bonded to a backside of a wafer as a processing object, which has a plate shape. The wafer provides a piezo element. The wafer is diced with a laser beam. Specifically, the wafer is cut and separated from a reforming portion as a starting point. When the wafer is divided into multiple piezo element chips, the dicing film protects the chips from spattering.

The dicing film is made of resin tape having adhesiveness. Specifically, one side of the dicing film has the adhesiveness so that the one side adheres to the wafer. In general, the periphery of the dicing film is held by a holder so that a certain tension is applied to the dicing film. Then, the holder with the dicing film is mounted on a base table, and the laser beam is irradiated on the wafer disposed on the dicing film. Thus, the reforming portion is formed in the wafer, and then, a pressure is applied to the wafer so that the wafer is pressed up from the backside of the dicing film. Thus, a crack is generated at the reforming portion as the starting point, and the crack becomes larger so that the wafer is cut and separated.

In this case, the particle removed from the dicing surface of the wafer is absorbed by an absorber. Thus, the dust, i.e., the particle from the dicing surface is removed from the wafer. The absorber absorbs the particle from the surface of the wafer. Accordingly, the air flow generated by the absorber for absorbing the particle directs to the upward of the wafer. Thus, the particle to be absorbed by the absorber may float above the wafer. Thus, the particle floating above the wafer is scattered in a wide range so that the particle spreads on the wafer or the chip. Thus, the yielding ratio of the chip and the quality of the chip are reduced.

Further, it is difficult to absorb the particle completely. Thus, residual particle may be adhered on the wafer or the chip, so that the yielding ratio of the chip and the quality of the chip are reduced. This particle is generated not only in a step of dicing the wafer but also in a step of laser abrasion.

SUMMARY OF THE INVENTION

In view of the above-described problem, it is an object of the present disclosure to provide a device separated from a wafer. It is another object of the present disclosure to provide a semiconductor device. It is further another object of the present disclosure to provide a dicing sheet. It is another object of the present disclosure to provide a dicing device. It is another object of the present disclosure to provide a method for processing a wafer. It is another object of the present disclosure to provide a method for dicing a wafer. It is another object of the present disclosure to provide a method for dicing a semiconductor substrate.

According to a first aspect of the present disclosure, a device separated from a wafer includes: a chip having a sidewall, which is provided by a dicing surface of the wafer in a case where the device is separated from the wafer; and a protection member disposed on the sidewall of the chip for protecting the chip from being contaminated by a dust from the dicing surface. In this case, a particle is prevented from being removed from the dicing surface of the wafer. Here, when the chip is separated from the wafer, the dicing surface of the wafer is covered with the protection member so that the particle is prevented from being removed from the dicing surface of the wafer. Further, after the chip is separated from the wafer, the dicing surface of the wafer is covered with the protection member so that the particle is prevented from being removed from the dicing surface of the wafer. Thus, a yielding ratio and quality of the chip are improved.

According to a second aspect of the present disclosure, a method for processing a wafer includes: dividing the wafer into multiple chips; and covering a sidewall of each chip with a protection member for protecting the chip from being contaminated by a dust from a dicing surface of the wafer. In this method, when the chip is separated from the wafer, the sidewall of the chip is covered with the protection member. Thus, a particle is prevented from being removed from the sidewall of the chip, which is the dicing surface of the wafer, when the chip is separated from the wafer or after the chip is separated from the wafer. Thus, a yielding ratio and quality of the chip are improved.

According to a third aspect of the present disclosure, a semiconductor device includes: a dicing film; a semiconductor wafer disposed on the dicing film, wherein the wafer is capable of being divided into a plurality of chips along with a cutting line; a protection member disposed on a part of the wafer, which covers the cutting line of the wafer, wherein the part of the wafer is opposite to the dicing film; and a plurality of reforming portions disposed in the wafer, which is arranged along with the cutting line. In this case, a particle is prevented from being removed from the dicing surface of the wafer. Thus, a yielding ratio and quality of the chip are improved.

According to a fourth aspect of the present disclosure, a dicing sheet includes: a dicing film capable of adhering to a plate object, which is to be separated into a plurality of chips, wherein the dicing film is capable of holding the chips thereon after the plate object is separated into the chips; and a first through hole disposed in a part of the dicing film, which corresponds to the plate object. In this case, even when a particle is generated from a dicing surface of the plate object, the particle is retrieved from the object through the first through hole. Thus, the particle is prevented from floating above the plate object, so that the particle is not scattered on the plate object. Thus, the yielding ratio and quality of the chips are improved.

According to a fifth aspect of the present disclosure, a method for dicing a wafer includes: bonding the dicing sheet on the plate object; irradiating a laser beam on the plate object along with a cutting line of the plate object so that a reforming portion is formed in the plate object by multiple photo absorption effect of the laser beam; cutting the plate object from the reforming portion as a starting point of cutting; and absorbing a particle generated from a cut surface of the plate object through the first through hole of the dicing film so that the particle is absorbed toward a backside of the dicing film, wherein the backside of the dicing film is opposite to the plate object. In this case, the particle is prevented from floating above the plate object, so that the particle is not scattered on the plate object. Thus, the yielding ratio and quality of the chips are improved.

According to a sixth aspect of the present disclosure, a method for dicing a wafer includes: bonding the dicing sheet on the plate object; irradiating a laser beam on the plate object along with a cutting line of the plate object so that a reforming portion is formed in the plate object by multiple photo absorption effect of the laser beam; cutting the plate object from the reforming portion as a starting point of cutting; and absorbing a particle generated by irradiation of the laser beam in the irradiating the laser beam through the first and/or second through holes of the dicing film so that the particle is absorbed toward a backside of the dicing film, wherein the backside of the dicing film is opposite to the plate object. In this case, the particle is prevented from floating above the plate object, so that the particle is not scattered on the plate object. Thus, the yielding ratio and quality of the chips are improved.

According to a seventh aspect of the present disclosure, a dicing device for dividing a semiconductor substrate into a plurality of chips includes: a dicing film, on which the semiconductor substrate is disposed; a laser element for irradiating a laser beam on the semiconductor substrate in order to provide a reforming portion in the substrate; and an expand device for mounting the dicing film and for expanding the dicing film in order to dividing the substrate into the chips. The dicing film is mounted on the expand device in such a manner that the substrate on the dicing film is disposed downward in order to fall a particle downward freely, and the particle is derived from a dicing surface of the substrate.

In this device, the particle falls freely downwardly, so that the particle is removed from the surface of the substrate. Thus, the particle is prevented from adhering on the substrate. Accordingly, the yielding ratio and the quality of the chips are improved.

According to a eighth aspect of the present disclosure, a method for dicing a semiconductor substrate into a plurality of chips, includes: bonding a semiconductor substrate on a dicing film; irradiating a laser beam on the substrate in order to form a reforming portion in the substrate; and expanding the substrate through the dicing film in order to divide the substrate into the chips. In the expanding the substrate, the dicing film is mounted on an expand device in such a manner that the substrate on the dicing film is disposed downward in order to fall a particle downward freely, and the particle is derived from a dicing surface of the substrate.

In this method, the particle falls freely downwardly, so that the particle is removed from the surface of the substrate. Thus, the particle is prevented from adhering on the substrate. Accordingly, the yielding ratio and the quality of the chips are improved.

BRIEF DESCRIPTION OF THE DRAWINGS

The above and other objects, features and advantages of the present invention will become more apparent from the following detailed description made with reference to the accompanying drawings. In the drawings:

FIG. 27 is a cross sectional view explaining another method for processing a wafer with a laser beam.

DETAILED DESCRIPTION OF THE PREFERRED EMBODIMENTS

First Embodiment

Figure 1A:
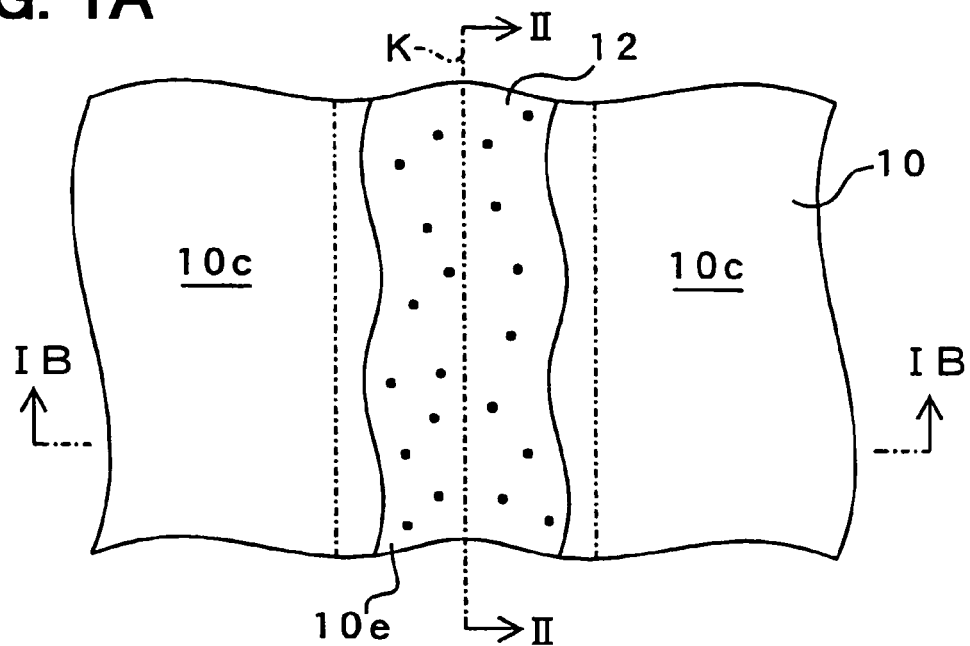
FIG. 1A is a plan view explaining a method for processing a wafer with a laser beam.
Figure 1B:
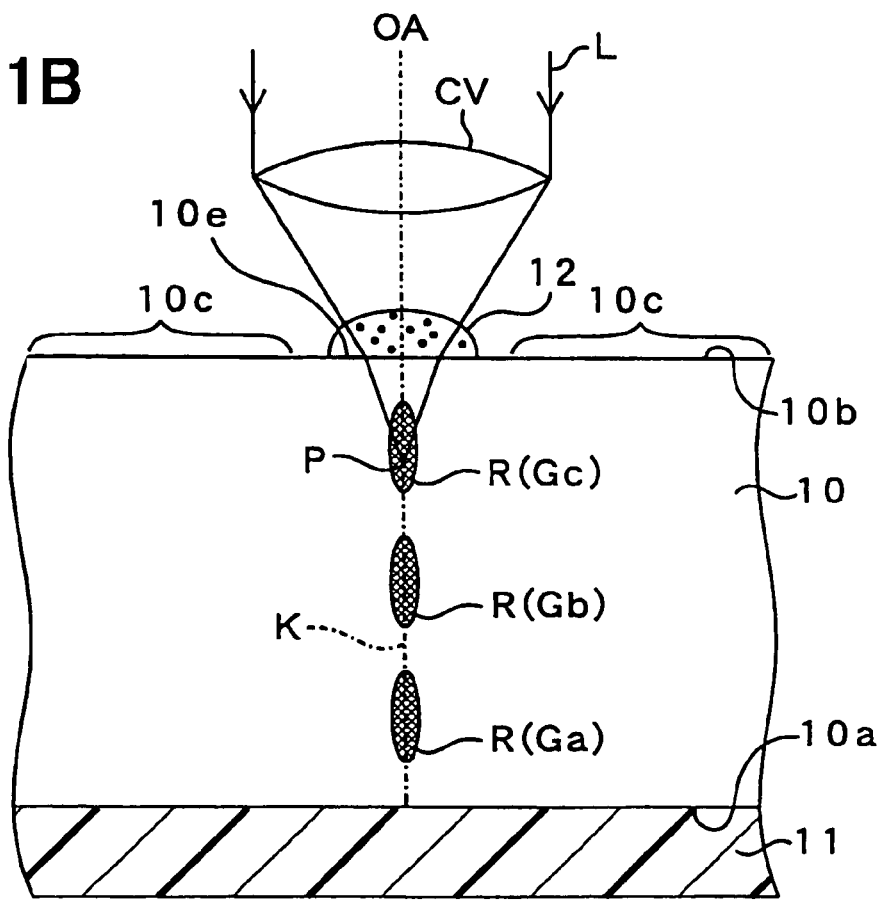
FIG. 1B is a cross sectional view showing the wafer taken along line IB-IB in FIG. 1A.
Figure 2:
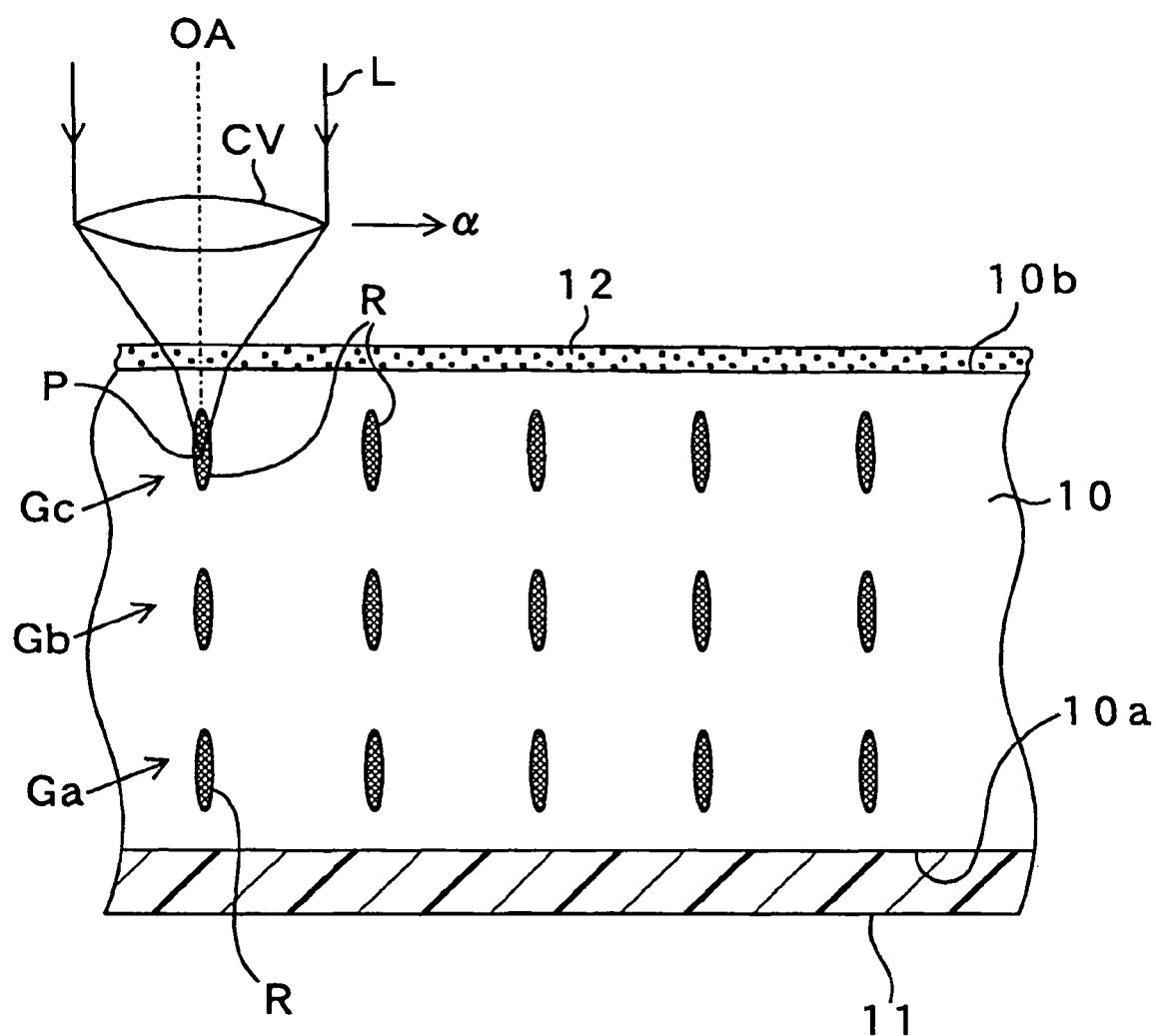
FIG. 2 is a cross sectional view showing the wafer taken along line II-II in FIG. 1A.

FIGS. 1A, 1B and 2 show a method for processing a wafer. Specifically, FIGS. 1A, 1B and 2 explain a step of forming a reforming portion by irradiating a laser beam on a wafer 10. The wafer 10 such as a bulk silicon wafer is made from bulk single crystal silicon, and has a backside 10a. A dicing film 11 such as a dicing seat, a dicing tape or an expandable tape is formed on the backside 10a of the wafer 10.

The dicing film 11 is made from a plastic film. The dicing film 11 is extendable by applying a force in an extendable direction and by heating. The dicing film 11 is adhered on whole area of the backside of the wafer 10 with adhesive (not shown).

A device forming region 10c is formed on the foreside 10b of the wafer 10. In the device forming region 10c, a semiconductor device (not shown) is formed. The semiconductor device is, for example, a monolithic IC, a semiconductor element, a sensor or a micro-machine. The sensor and the micro-machine are formed by a MEMS method.

A laser processing apparatus (not shown) includes a laser beam source (not shown) for emitting a laser beam L and a condenser lens CV. The optical axis OA of the laser beam L is set to be perpendicular to the surface 10b of the wafer 10, and the laser beam L is irradiated on the surface 10b through the condenser lens CV. Here, the surface 10b of the wafer 10 provides an incident surface of the laser beam L. Then, a focus point, i.e., focal point, P is aligned at a predetermined position in the wafer 10. The laser beam L is focused at the focus point P. Thus, a reforming portion, i.e., a reforming layer, is formed around the focus point P.

Here, the laser beam L is, for example, a laser beam having a wavelength of 1064 nanometer in an infrared light region emitted from a YAG (yttrium aluminum garnet) laser device.

The reforming portion R includes a melting region, which is melted by multiple photo absorption effect. The multiple photo absorption effect is occurred by radiation of the laser beam L.

Specifically, the portion around the focus point P in the wafer 10 is heated locally by the multiple photo absorption effect of the laser beam L, so that the portion is melted. After that, the melted portion becomes solidified again. Thus, the portion solidified again after the portion is melted provides the reforming portion R.

The melting region is a region having a different crystal structure or a region, a phase of which is changed. Specifically, the melting region is a region, a material of which is changed from single crystal silicon to amorphous silicon, a region, a material of which is changed from single crystal silicon to poly crystal silicon, or a region, a material of which is changed from single crystal silicon to mixture of amorphous silicon and poly crystal silicon. Since the wafer 10 is a bulk silicon wafer, the reforming portion is made of, mainly, poly crystal silicon.

The reform portion is not formed by normal absorption effect but by the multiple photo absorption effect. Here, the normal absorption effect is provided by absorbing the laser beam L in the wafer 10, and the normal absorption effect provides heating of the laser beam L.

The laser beam L is not substantially absorbed in a portion other than the portion near the focus point P in the wafer 10, i.e., the laser beam L is almost absorbed in the portion near the focus point P. Accordingly, the surface 10b of the wafer 10 is not melted and modified.

The laser processing device irradiates the laser beam L with pulse irradiation, and scans the laser beam L under a condition that the depth of the focus point P from the surface 10b of the wafer 10 is constant. Thus, the focus point P is scanned along with a cutting line K, i.e., a dicing line toward a scan direction α. The cutting line K is linear, and provides a wafer-to-be-cut line.

Although the laser processing device scans the laser beam L, a mounting base for mounting the wafer 10 may be moved toward a direction opposite to the direction α, which is perpendicular to an incident direction of the laser beam L, under a condition that the radiation position of the laser beam L is constant.

Thus, when the laser beam L is scanned, or when the wafer 10 is moved, the focus point P is relatively moved with respect to the wafer 10. One of reforming groups Ga, Gb, Gc having multiple reforming portions R is formed. Specifically, in each reforming group Ga, Gb, Gc, multiple reforming portions R are disposed with a predetermined depth from the surface 10b of the wafer 10 along with the direction α, which is parallel to the horizontal direction of the wafer 10. Specifically, the reforming portions in each group Ga, Gb, Gc is disposed inside of the wafer from the incident surface (i.e., the surface 10b) of the laser beam L. The reforming portions R are aligned by a predetermined interval.

Here, the depth of the focus point P in the wafer 10 is a distance between the surface 10b of the wafer 10 and the focus point P.

The laser processing device can change the depth of the focus point P in a stepwise manner. Thus, multiple reforming groups Ga, Gb, Gc are formed in turn along with the cutting line K of the wafer 10. One of the groups Ga, Gb, Gc is disposed with a predetermined depth from the surface 10b of the wafer 10, and separated, adjacent to, or overlapped with each other. Here, the depth direction of the wafer 10 is a thickness direction of the wafer 10, a cross sectional direction of the wafer 10, and a direction perpendicular to the foreside 10b and the backside 10a of the wafer 10.

Specifically, the depth of the focus point P of the laser beam L in the depth direction, i.e., the incident direction of the laser beam L, is changed in a stepwise manner, and the laser beam L scans along with the scan direction α. Thus, the reforming portions R are aligned in each group Ga, Gb, Gc.

For example, firstly, the depth of the focus point P is set near the backside 10a of the wafer 10, and the laser beam L is moved relatively with respect to the wafer 10. Thus, the first reforming group Ga disposed on a lowest layer is formed. Then, the depth of the focus point P is set to be the middle of the wafer 10, and the laser beam L is scanned with respect to the wafer 10. Thus, the second reforming group Gb disposed on the middle of the wafer 10 is formed. Finally, the depth of the focus point P is set near the foreside 10b of the wafer 10, and the laser beam L is moved relatively with respect to the wafer 10. Thus, the third reforming group Gc disposed on a top layer is formed.

Although three reforming groups ga, Gb, Gc are formed in the wafer, the number of the groups may be set in accordance with the thickness of the wafer 10. For example, two reforming groups or four reforming groups may be formed in the wafer 10.

It is preferred that the first to third groups Ga, Gb, Gc are formed in this order. Specifically, a deeper group from the incident surface of the laser beam is formed earlier than a shallower group.

For example, when a shallower group from the incident surface of the laser beam L is formed earlier than a deeper group, the laser beam L is scattered by the shallower group in a case where the deeper group is formed. Specifically, when the third group Gc is formed earlier than the first group Ga, the laser beam L is scattered by the third group Gc in a case where the first group Ga is formed. Accordingly, the reforming portions R in the deeper group, i.e., the first group Ga, may not be formed accurately. Specifically, the dimensions of the reforming portions R in the first group Ga may be varied, so that the first group Ga is not formed homogeneously.

However, when a deeper group from the incident surface of the laser beam L is formed earlier than a shallower group, the laser beam L is not scattered since no reforming portion R is disposed between the incident surface of the laser beam, L and the focus point P. Thus, the reforming portions in the shallower group can be formed without scattering the laser beam L. Thus, each group Ga, Gb, Gc can be formed homogeneously. Specifically, when the first group Ga is formed earlier than the third group Gc, the laser beam L is not scattered by the first group Ga in a case where the third group Gc is formed. Accordingly, the reforming portions R in the shallower group, i.e., the third group Gc, is formed accurately. Specifically, the dimensions of the reforming portions R in the third group Gc are homogeneous, so that the third group Gc is formed homogeneously.

Here, the order of forming the groups Ga, Gb, Gc may be determined by an experimental result. Accordingly, even when the shallower group from the incident surface of the laser beam L is formed earlier than the deeper group, or when the groups Ga, Gb, Gc are formed with a random order, the reforming portions R in each group Ga, Gb, Gc may have a certain level of homogeneity. Thus, the order of forming the groups Ga, Gb, Gc depends on the required accuracy.

The method for forming the groups Ga, Gb, Gc in the wafer 10 by changing the depth of the focus point P is such that:

1. A laser head composed of a laser beam source and a condenser lens CV is displaced in a vertical direction of the wafer 10 so that the depth of the focus point P is changed;

2. The base table for mounting the wafer 10 is displaced in a vertical direction of the wafer 10 so that the depth of the focus point P is changed; or 3. Both of the laser head and the base table are displace in a vertical direction of the wafer 10 so that the depth of the focus point P is changed.

The above third method provides a short process time, compared with the above first and second methods. In the third method, the laser head is displaced oppositely to the displacement of the base table.

After the reforming groups Ga, Gb, Gc are formed in the wafer 10, a thermoplastic member 12 is formed on a part 10e of the surface 10b of the wafer 10. The part 10e of the surface 10b covers the cutting line K, and, the laser beam L is irradiated on the part 10e of the surface 10b. The part 10e of the surface 10b does not overlap the device forming region 10c.

The thermoplastic member 12 may be formed on the part 10e of the surface 10b by any method. For example, melted thermoplastic material is applied on the part 10e of the surface 10b, and then, the melted thermoplastic material is hardened so that the thermoplastic member 12 is formed. Alternatively, the thermoplastic member 12 is bonded on the part 10e of the surface 10b.

Figure 3A:
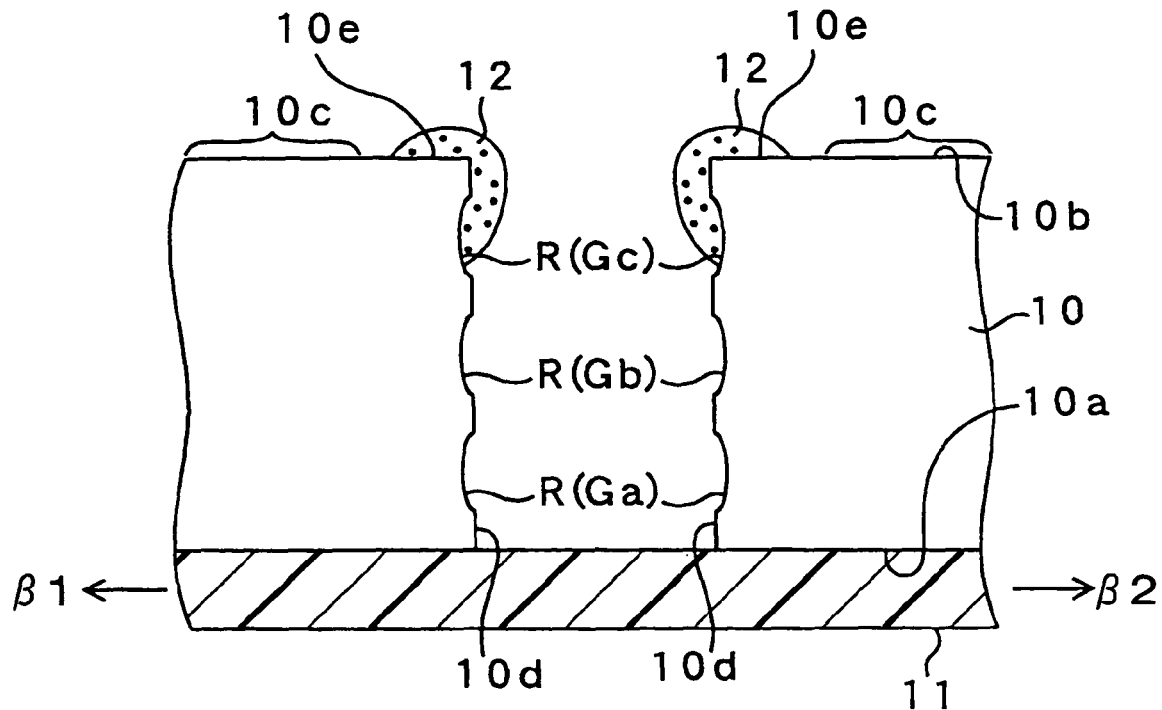
FIGS. 3A and 3B are cross sectional views explaining the method for processing the wafer.
Figure 3B:
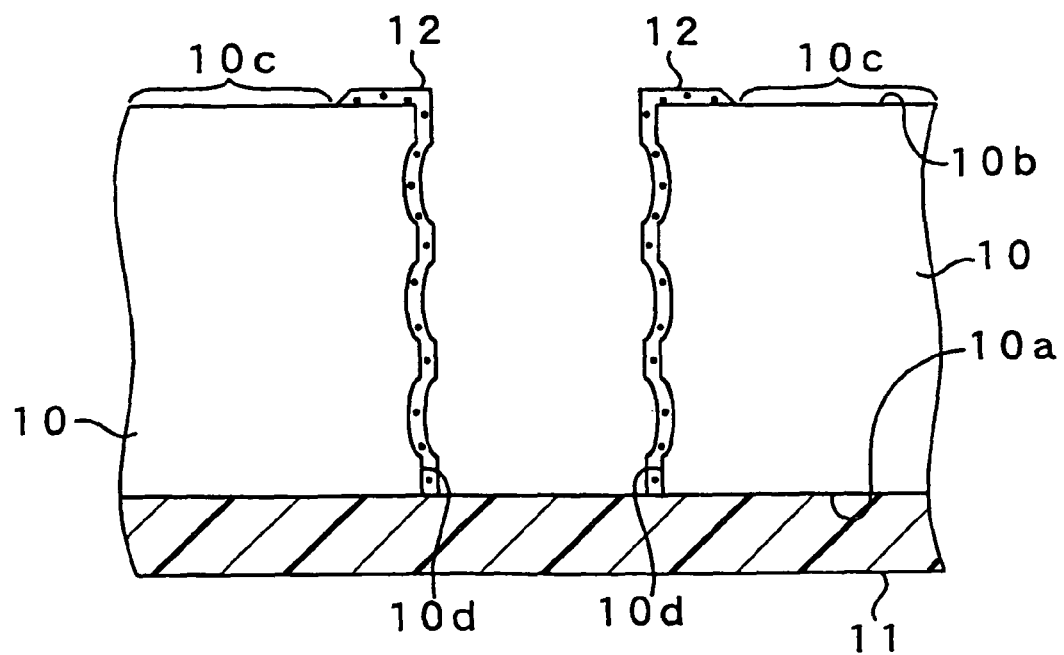

FIGS. 3A and 3B show a method for dividing the wafer 10, and correspond to a cross section of FIG. 1A taken along line IB-IB.

The wafer 10 is heated, and the wafer 10 is arranged to turn the surface 10b upward. Thus, the wafer 10 is disposed horizontally, and the dicing film 11 is extended in the horizontal direction with respect to the cutting line K, i.e., both sides of the dicing film 11 are pulled in both directions β1, β2. In this case, a tensile stress is applied to each group Ga, Gb, Gc.

Then, a shear stress is generated in the wafer 10. Firstly, a crack is generated from the first group Ga disposed on the lowest layer near the dicing film 11 toward the surface 10b. Specifically, the crack is formed from the first group Ga as a starting point toward the surface 10b along with the depth direction. Next, another crack is generated from the second group Gb disposed on the middle of the wafer 10. Then, further another crack is generated from the third group Gc disposed on the top layer of the wafer 10. Thus, the crack generated from each group Ga, Gb, Gc becomes larger so that the cracks link together. When the linked cracks reach the foreside 10b and the backside 10a of the wafer 10, the wafer 10 is cut and separated.

Multiple chips (not shown) are formed in the wafer 10, which has a disk shape. The chips are arranged on the surface 10b of the wafer 10 in a grid. Accordingly, the cutting line K is disposed between the chips, so that multiple cutting lines K are formed on the surface 10b in a grid.

Accordingly, after the reforming groups Ga, Gb, Gc are formed along with multiple cutting lines K, the dicing film 11 is extended so that the wafer 10 is divided into multiple chips.

Since the reforming groups Ga, Gb, Gc are formed along with each cutting line K, the tensile stress is appropriately applied to the reforming groups Ga, Gb, Gc by pulling the dicing film 11. The wafer 10 is cut and divided with a comparatively small force without generating unnecessary crack in the wafer 10. Thus, the separation of the wafer 10 is performed with high accuracy from the reforming portions R as the starting point of separation.

At this time, since the wafer 10 is heated and disposed horizontally with the surface 10b upwardly, the thermoplastic member 12 is melted by heat.

As shown in FIG. 3A, the melted thermoplastic member 12 penetrates (i.e., falls) into the dicing surface 10d of the wafer 10 because of the gravity while the wafer 10 is cut and separated. Here, the melted thermoplastic member 12 has low viscosity and high fluidity. The dripped thermoplastic member 12 covers the dicing surface 10d, as shown in FIG. 3B.

After the thermoplastic member 12 covers the dicing surface 10d of the wafer 10, heating of the wafer 10 is stopped. Thus, the thermoplastic member 12 is cooled and hardened in a manner that the thermoplastic member 12 covers the dicing surface 10d.

When the wafer 10 is cut and separated, the dicing surface 10d is covered with the thermoplastic member 12. Accordingly, when the wafer 10 is separated, and/or after the wafer 10 is separated, a particle is prevented from being removed from the dicing surface 10d.

Here, the dicing surface 10d of the wafer 10 is an outer sidewall of the chip, which is separated from the wafer 10. Thus, the dicing surface 10d, i.e., the outer sidewall of the chip is covered with the thermoplastic member 12.

Thus, the particle from the wafer 10 is not adhered to a semiconductor device on the chip, the element which is formed in the device forming region 10c. The yielding ratio of the chip and the quality of the chip are improved.

For example, in a case where a monolithic IC as a semiconductor device is formed on the chip, when the particle is attached on the semiconductor element or a wiring in the monolithic IC, the particle may cause short-circuit. However, in the above method, the particle is not adhered on the semiconductor device, so that the short-circuit of the device is protected.

In a case where a sensor such as a pressure sensor, an acceleration sensor and a supersonic sensor composed of a piezo-electric element and/or a capacitor or a micro-machine is formed on the chip by using a micro electro mechanical system method (i.e., MEMS method), when the particle is attached on a movable portion composing the sensor or the micro machine, the particle may prevent the movable portion from displacing. Thus, performance such as sensitivity in the sensor or the micro machine is reduced. However, in the above method, the particle is not adhered on the sensor or the micro machine, so that the performance of the sensor or the micro machine is not reduced.

Since the thermoplastic member 12 is disposed apart from the device forming region 10c, the melted thermoplastic member 12 is not substantially diffused on the surface 10b of the wafer 10 when the thermoplastic member 12 falls into the dicing surface 10d. Thus, the thermoplastic member 12 does not reach the device in the device forming region 10c.

The thermoplastic member 12 may be made of any material as long as the thermoplastic member 12 has thermoplasticity. For example, the thermoplastic member 12 is made of rubber such as natural rubber and synthetic rubber, plastic material such as thermoplastic resin, or wax.

The synthetic rubber is, for example, diene series rubber, polysulfide series rubber, olefin series rubber, organosilicon series rubber, fluorine compound series rubber, urethane series rubber or vinyl series rubber.

The plastic material is, for example, polymerization series rubber such as hydro carbon series rubber, acrylic series rubber, vinyl acetate series rubber and halogen series rubber, condensation series rubber such as polyether series rubber, amino series rubber, polyester series rubber, polyamide series rubber, poly urethane series rubber, polyether series rubber, phenol series rubber and epoxy series rubber, or semisynthetic macromolecule series rubber such as cellulose series rubber and protein series rubber.

A method for performing both of separation of the wafer 10 and heating the wafer 10 at the same time is such that: the wafer 10 is accommodated in a chamber heated by an electric heater, and the dicing film 11 is extended; or the dicing film 11 is extended together with irradiating the wafer 10 with infrared light.

In this embodiment, the focus point P of the laser beam L is aligned at a predetermined position in the wafer 10, and the laser beam L is irradiated on the wafer 10. Multiple reforming groups Ga, Gb, Gc composed of multiple reforming portions R are formed in the wafer 10 along with the cutting line K by the multiple photo absorption effect. Then, the thermoplastic member 12 is formed on the part 10e of the surface 10b of the wafer 10, which covers the cutting line K.

Accordingly, since the thermoplastic member 12 is not disposed on the surface 10b when the laser beam L is irradiated on the wafer 10, the laser beam L is not scattered by the thermoplastic member 12. Thus, the focus point P of the laser beam L is accurately aligned at the predetermined position in the wafer 10.

When the thermoplastic member 12 does not scatter the laser beam L, the thermoplastic member 12 may be formed on the part 10e of the surface 10b before the wafer 10 is irradiated with laser beam L. Then, the laser beam L is irradiated on the wafer 10 so that the reforming groups Ga, Gb, Gc are formed in the wafer 10.

Although the member 12 is made of thermoplastic material, the member 12 may be made of thermosetting material. In this case, in a case where the thermosetting material is in a solid phase at a room temperature, and the thermosetting material is in a liquid phase or a gel state at a predetermined temperature higher than the room temperature, the member 12 made of thermosetting material is heated when the wafer 10 is cut and separated.

In a case where the thermosetting material is in a liquid phase or a gel state at a room temperature, it is not required for the member 12 made of thermosetting material to heat when the wafer 10 is cut and separated. Accordingly, after the wafer 10 is cut and separated, the member 12 made of thermosetting material is heated so that the member 12 covers the dicing surface 10d.

In the above case, the thermosetting material is made of any material as long as the material has thermosetting character. The thermosetting material is made of, for example, rubber such as synthetic rubber, plastic material such as thermosetting resin, or wax.

Although the member 12 is made of thermoplastic material, the member 12 may be made of photosensitive material. In this case, after the wafer 10 is cut and separated, a light such as visible light or a ultraviolet light is irradiated on the member 12 so that the member 12 is hardened. Thus, the dicing surface 10d of the wafer 10 is covered with the member made of photosensitive material. The photosensitive material may be any material as long as the material has photosensitivity. For example, the photosensitive material is plastic material such as photosensitive resin.

Although the member 12 is made of thermoplastic material, the member 12 may be made of chemical reaction curable (i.e., hardening) material, catalytic curable (i.e., hardening) material, solvent evaporation curable (i.e., hardening) material, or solvent dry curable (i.e., hardening) material. In this case, after the wafer 10 is separated, a predetermined time passes. During the predetermined time, the chemical reaction hardening, catalytic hardening, solvent evaporation hardening, or solvent dry hardening is performed. Thus, the member 12 covers the dicing surface 10d. The chemical reaction curable material, catalytic curable material, solvent evaporation curable material, or solvent dry curable material is made of any material as long as the material is chemical reaction curable, catalytic curable, solvent evaporation curable, or solvent dry curable. The chemical reaction curable material, catalytic curable material, solvent evaporation curable material, or solvent dry curable material is made of, for example, rubber such as synthetic rubber or plastic material. The chemical reaction curable material is, for example, cyanocrylate series resin or two-solution type epoxy resin, which is hardened with water on a surface as catalyst.

In this embodiment, after the member 12 covers the dicing surface 10d of the wafer 10, the member 12 is hardened. Alternatively, in a case where it is not necessary for the member 12 covering the dicing surface 10d to be hardened in a post process such as a mounting process, a bonding process and a resin sealing process after the wafer 10 is separated, the member 12 may maintain to be melted after the wafer 10 is separated. Specifically, without hardening the melted member 12, the dicing surface 10d is covered with the melted member 12. In this case, it is not requested for the member 12 to have curability. Thus, after the member 12 is heated and melted, the member 12 may be in a liquid phase or a gel state even at a room temperature.

Although the wafer 10 is formed of a bulk silicon wafer, the wafer 10 may be made of another wafer such as a multi-layered wafer. In this case, the wafer 10 may be a bonding type SOI substrate, a SIMOX (i.e., separation by implanted oxygen) wafer, a conventional SOI substrate, in which a polycrystal silicon layer or an amorphous silicon layer is formed on an insulation layer such as a glass substrate by using a solid phase growth method or a melting re-crystallization method, a wafer suitably used for a light emitting device, in which a III-V compound semiconductor layer is deposited on a substrate such as sapphire substrate, or a bonding wafer between a silicon substrate and a glass substrate by using an anodic bonding method.

Further, the wafer 10 may be made of a semiconductor substrate such as a gallium arsenide substrate.

Alternatively, the wafer 10 may be made of a material such as glass. In this case, the reforming portion R includes not only the melting region but also another region processed by the multiple photo absorption effect. For example, when the material of the wafer 10 includes a glass, the reforming portion R may include a crack region or a region having different refractive index different from original material. Here, the reforming portion R including the crack region or the region having different refractive index is disclosed in Japanese Patent No. 3408805.

Although the dicing film 11 is expanded so that the wafer 10 is separated, the wafer 10 may be separated by another method. For example, a rounded member such as a semi-spherical member is pressed on the cutting line K of the wafer 10 so that a pressure is applied to the wafer 10. Thus, a shear stress is generated from there forming portions R, so that the wafer 10 is separated and cut. Specifically, the rounded member has a curved surface having a predetermined curvature. The curved surface is applied on the wafer 10.

Second Embodiment

Figure 4A:
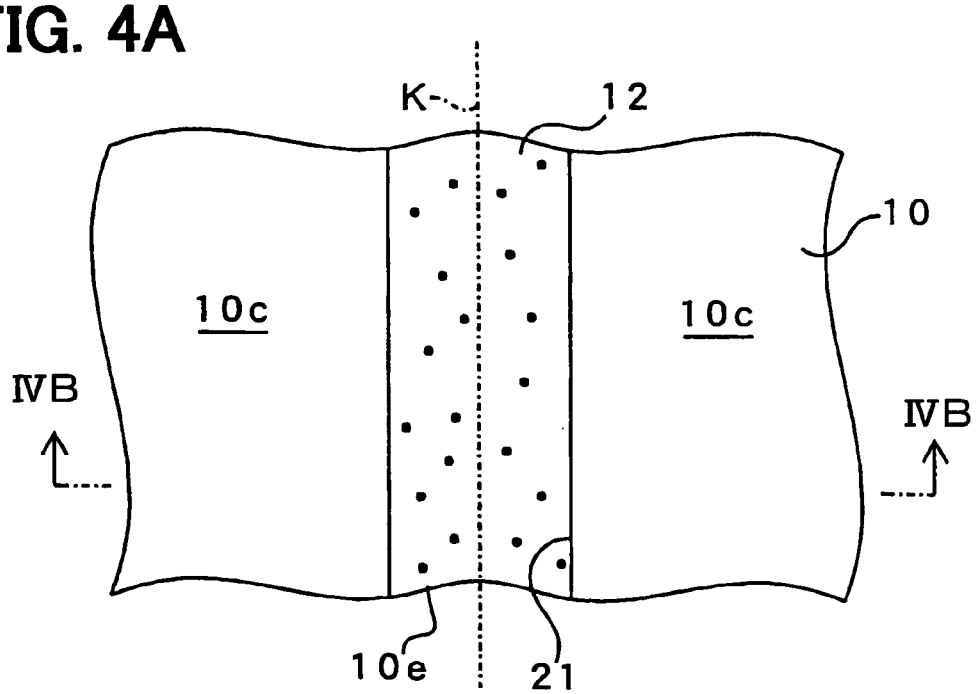
FIG. 4A is a plan view explaining another method for processing a wafer with a laser beam.
Figure 4B:
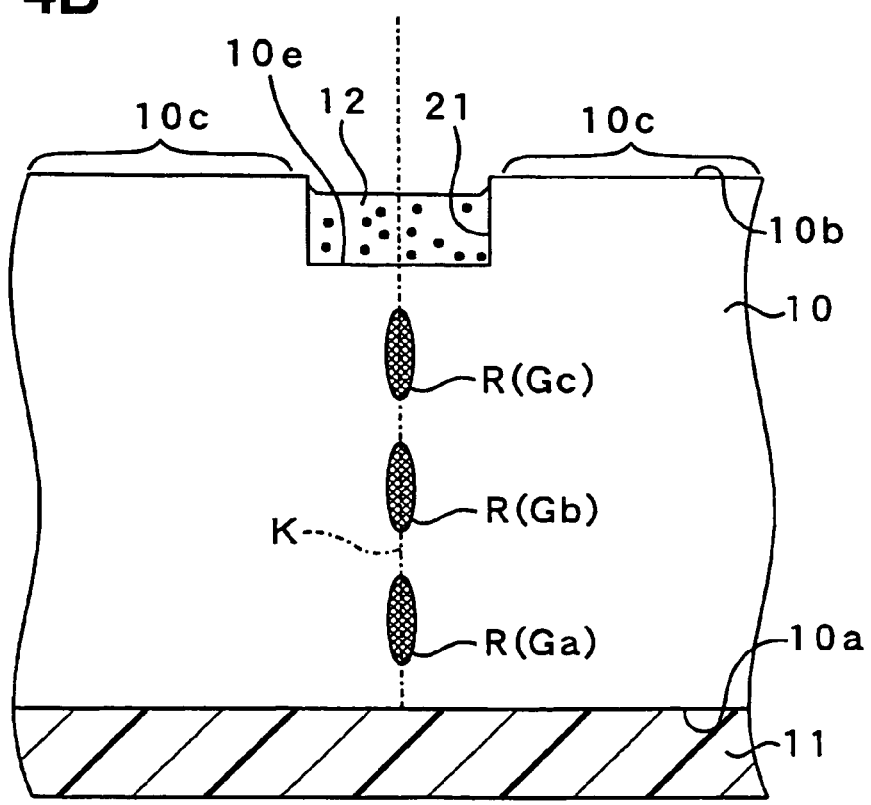
FIG. 4B is a cross sectional view showing the wafer taken along line IVB-IVB in FIG. 4A.

FIGS. 4A and 4B show a method for processing the wafer 10. Specifically, FIGS. 4A and 4B show another method for forming the reforming portions R in the wafer 10. The wafer 10 includes a concavity 21 on the surface 10b of the wafer 10. The concavity 21 is disposed on the part 10e of the wafer 10, and has a U-shaped cross section with a corner. The thermoplastic member 12 is formed in the concavity 21.

When the wafer 10 is cut and separated from the cutting line K, and the melted thermoplastic member 12 falls along with the dicing surface 10d, since the thermoplastic member 12 is accommodated in the concavity 21, the melted thermoplastic member 12 does not extend on the device forming region 10c. Specifically, the melted thermoplastic member 12 does not overflow from the concavity 21, and therefore, the thermoplastic member 12 does not reach the device forming region 10c on the surface 10b of the wafer 10. Thus, all melted thermoplastic member 12 falls down into the dicing surface 10d.

In this case, the thermoplastic member 12 is prevented from adhering to another part of the surface 10b of the wafer 10, specifically, adhering to the device forming region 10c. Accordingly, the semiconductor device formed in the device forming region 10c is not affected by the thermoplastic member 12. Further, the dicing surface can be cover with a minimum amount of the thermoplastic member 12.

Figure 5A:
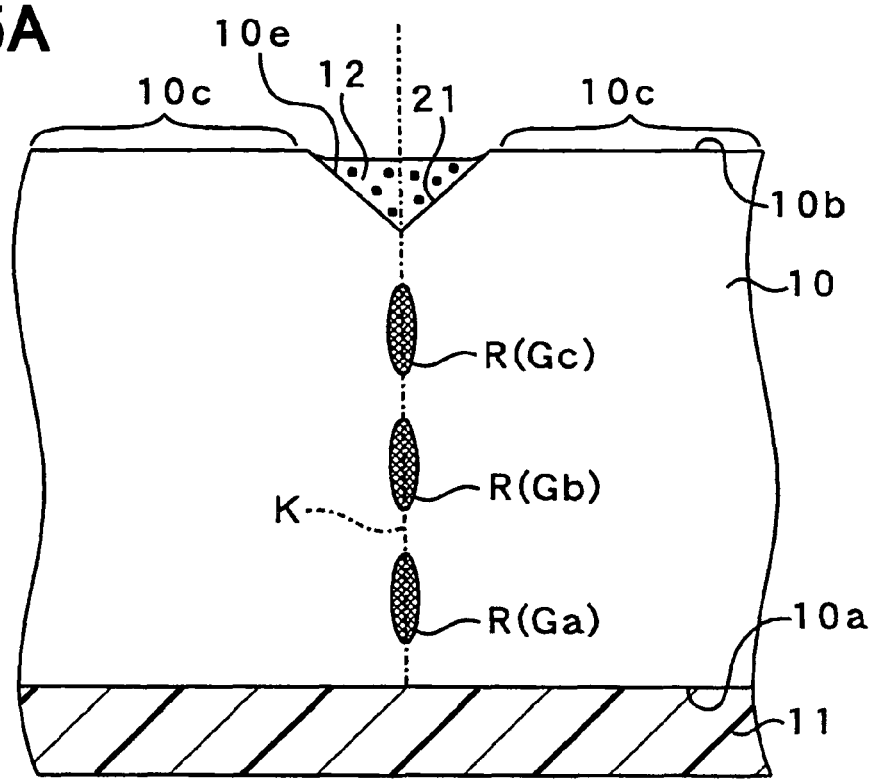
FIG. 5A is a cross sectional view explaining further another method for processing a wafer with a laser beam.

FIG. 5A shows a modification of the method for forming the reforming portions R in the wafer 10 shown in FIGS. 4A and 4B. In FIG. 5A, the concavity 21 has a V-shaped cross section.

Figure 5B:
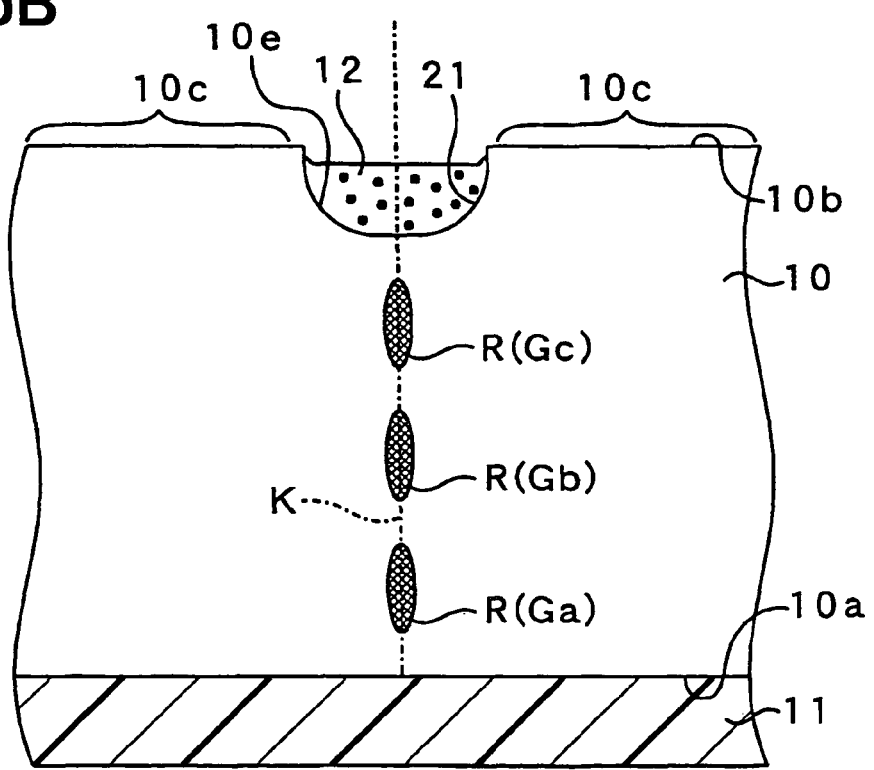
FIG. 5B is a cross sectional view explaining another method for processing a wafer with a laser beam.

FIG. 5B shows another modification of the method for forming the reforming portions R in the wafer 10 shown in FIGS. 4A and 4B. In FIG. 5B, the concavity 21 has a circular cross section, i.e., another U-shaped cross section with rounded corners.

The concavity 21 may have another shaped cross section other than the V-shaped, U-shaped or circular shaped cross section.

Third Embodiment

Figure 6A:
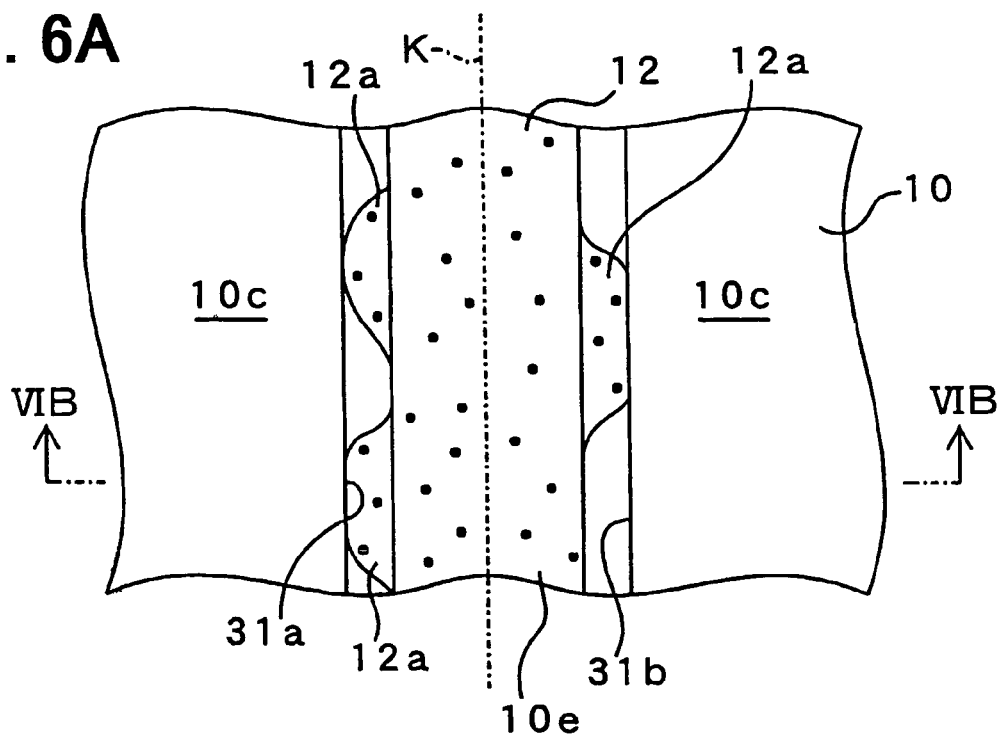
FIG. 6A is a plan view explaining another method for processing a wafer with a laser beam.
Figure 6B:
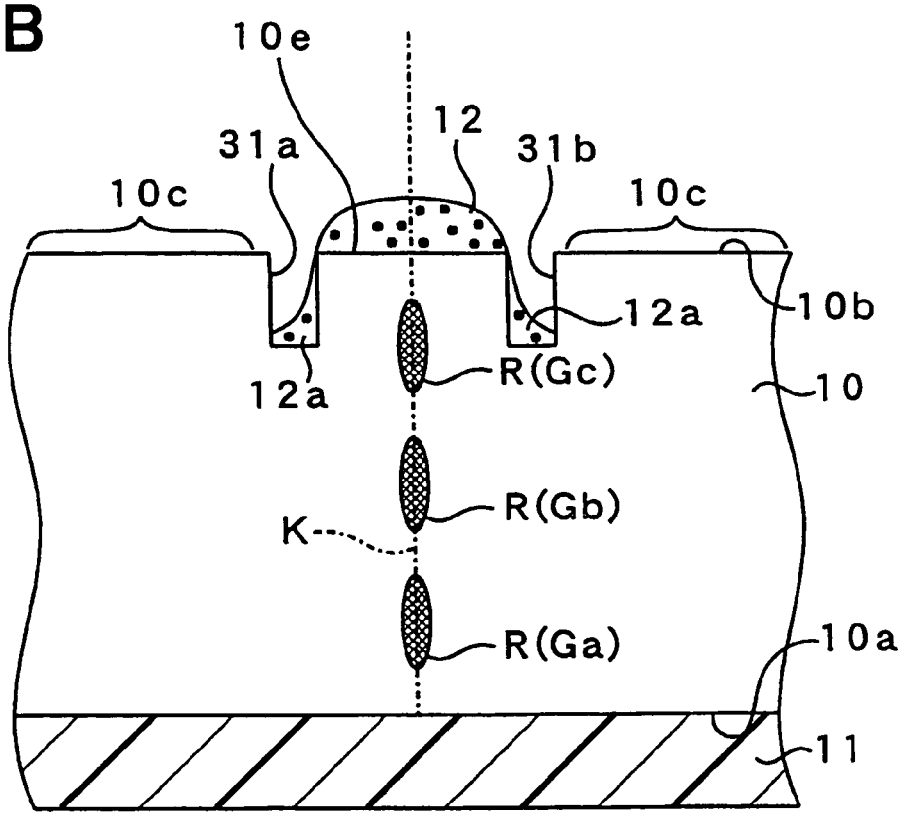
FIG. 6B is a cross sectional view showing the wafer taken along line VIB-VIB in FIG. 6A.

FIGS. 6A and 6B show a method for processing the wafer 10. Specifically, FIGS. 6A and 6B show further another method for forming the reforming portions R in the wafer 10.

The wafer 10 includes a pair of concavities 31a, 31b on the surface 10b of the wafer 10. Each concavity 31a, 31b are disposed between the cutting line K and the device forming region 10c, and has a U-shaped cross section with a corner. Thus, the concavities 31a, 31b are disposed in parallel to the cutting line K so that the cutting line K is sandwiched between the concavities 31a, 31b. Firstly, the thermoplastic member 12 is formed on the part 10e of the wafer 10.

When the wafer 10 is cut and separated from the cutting line K, and the melted thermoplastic member 12 falls along with the dicing surface 10d, since the concavities 31a, 31b are disposed between the part 10e of the wafer 10 and the device forming region 10c, the melted thermoplastic member 12 does not extend on the device forming region 10c. Specifically, even if the melted thermoplastic member 12 spreads from the part 10e of the wafer 10, the spread thermoplastic member 12a shown in FIG. 6B is introduced into the concavities 31a, 31b. Thus, the thermoplastic member 12 does not reach the device forming region 10c on the surface 10b of the wafer 10. The dimensions of the concavities 31a, 31b are determined on the basis of the material and volume of the thermoplastic member 12 so that the spread thermoplastic member 12 is surely introduced into the concavities 31a, 31b. Thus, no melted thermoplastic member 12 spreads on the device forming region 10c.

In this case, the thermoplastic member 12 is prevented from adhering to another part of the surface 10b of the wafer 10, specifically, adhering to the device forming region 10c. Accordingly, the semiconductor device formed in the device forming region 10c is not affected by the thermoplastic member 12.

Figure 7A:
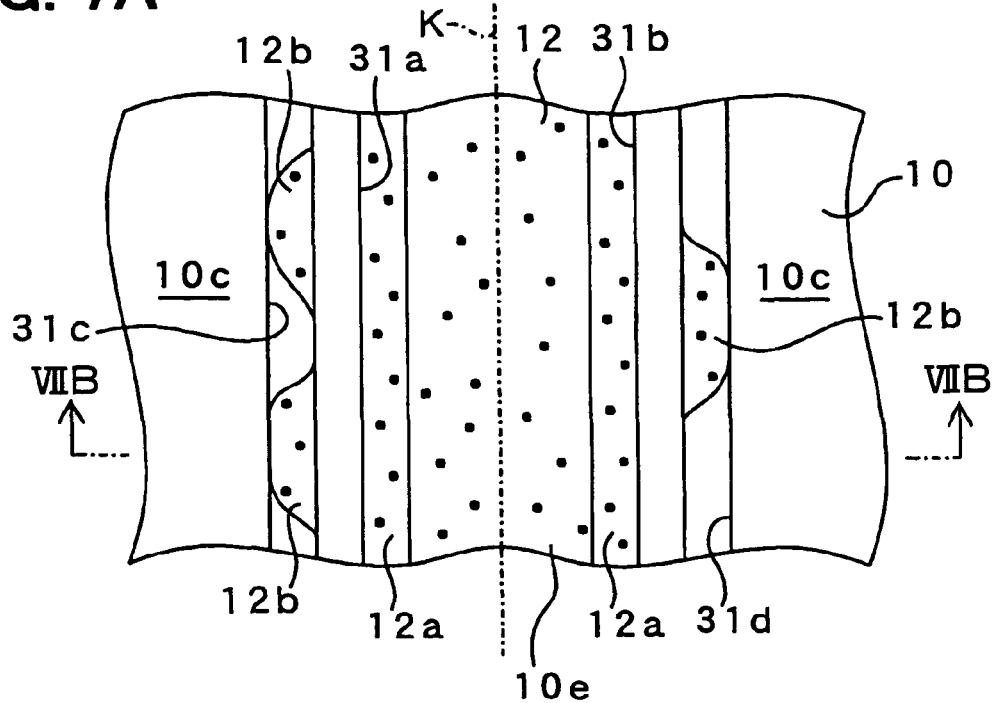
FIG. 7A is a plan view explaining another method for processing a wafer with a laser beam.
Figure 7B:
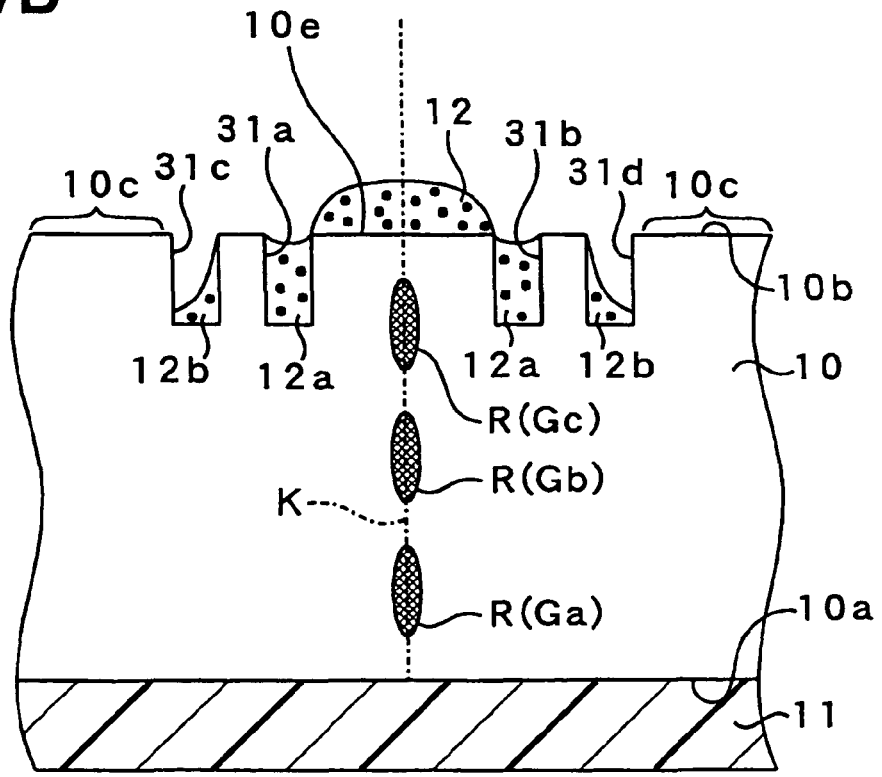
FIG. 7B is a cross sectional view showing the wafer taken along line VIIB-VIIB in FIG. 7A.

FIGS. 7A and 7B show a modification of the method for forming the reforming portions R in the wafer 10 shown in FIGS. 6A and 6B.

In FIGS. 7A and 7B, one of two pairs of concavities 31a-31d is disposed between the device forming region 10c and the part 10e of the wafer 10. Thus, double concavities 31a-31d are formed between the device forming region 10 and the cutting line K.

When the wafer 10 is cut and separated from the cutting line K, and the melted thermoplastic member 12 falls along with the dicing surface 10d, since the concavities 31a-31d are disposed between the part 10e of the wafer 10 and the device forming region 10c, the melted thermoplastic member 12 does not extend on the device forming region 10c. Specifically, even if the melted thermoplastic member 12 spreads from the part 10e of the wafer 10, the spread thermoplastic member 12a is firstly introduced into the concavities 31a, 31b. Further, even if the excess melted thermoplastic member 12 overflows from the concavities 31a, 31b, the overflowed thermoplastic member 12b is secondary introduced into the concavities 31c, 31d. Thus, the thermoplastic member 12 does not reach the device forming region 10c on the surface 10b of the wafer 10. The dimensions of the concavities 31a-31d are determined on the basis of the material and volume of the thermoplastic member 12 so that the spread thermoplastic member 12 is surely introduced into the concavities 31a-31d. Thus, no melted thermoplastic member 12 spreads on the device forming region 10c.

Although the wafer 10 has two pairs of concavities 31a-31d, the wafer 10 may have three or more pairs of concavities. In this case, the melted thermoplastic member 12 can be surely prevented from spreading on the device forming region 10c. Further, as the number of concavity increases, the melted thermoplastic member 12 can be prevented from spreading much more.

In FIGS. 6A to 7B, as the volume of concavities 31a-31d increases, the melted thermoplastic member 12 can be prevented from spreading much more.

However, when the wafer 10 includes many concavities, or when the volume of the concavities is large, the area of the concavities on the surface 10b of the wafer 10 becomes larger. Therefore, the number of chips on the wafer 10 becomes smaller. Thus, the volume of the concavities and the number of the concavities are determined based on the designing requirement of the chips.

Although the concavities 31a-31d have a U-shaped cross section with a corner, the concavities 31a-31d may have a U-shaped cross section with a rounded corners or a V-shaped cross section.

Fourth Embodiment

Figure 8A:
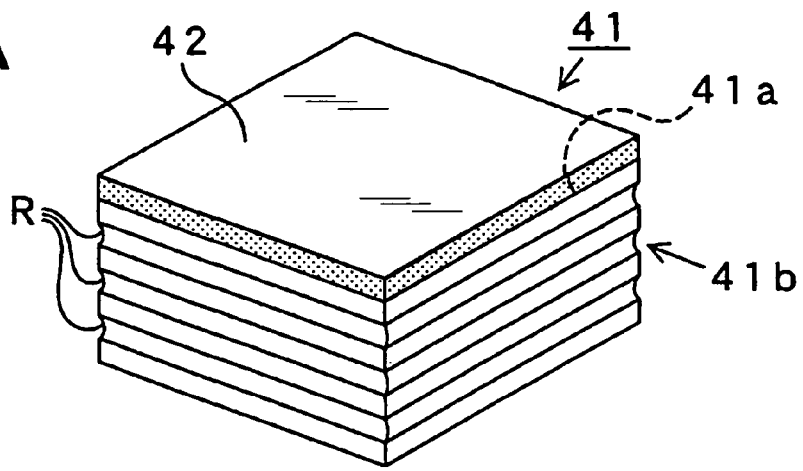
FIGS. 8A to 8C are schematic views explaining a method for processing a chip.
Figure 8B:
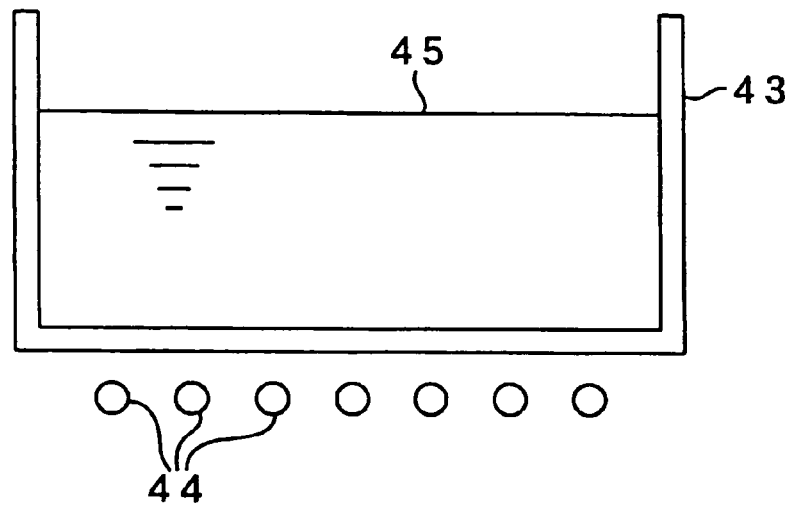
Figure 8C:
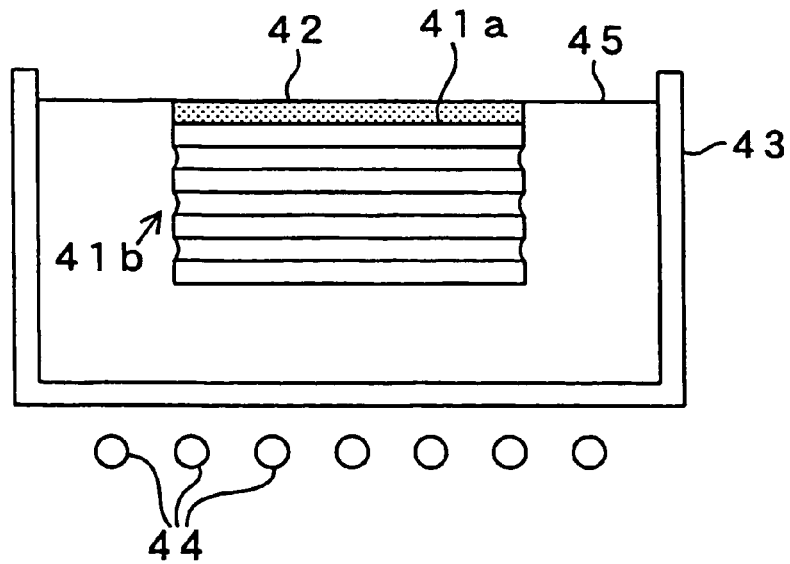

FIGS. 8A to 8C show a method for processing a chip 41. In the method, the reforming portions R are formed in the wafer by using a laser dicing method. Then, the wafer 10 is cut and separated from the reforming portions R as the starting point of dicing. In the wafer 10, no thermoplastic member 12 is formed on the part 10e of the wafer 10.

As shown in FIG. 8A, the semiconductor chip 41 is divided from the wafer 10. A surface 41a of the chip 41, on which the semiconductor device is formed, is covered with a sealing member 42.

As shown in FIG. 8B, a container 43 having an opening is arranged on an electric heater 44. A thermoplastic member 45 is accommodated in the container 43. Then, the container 43 is heated by the electric heater 44 so that the thermoplastic member 45 is melted. The thermoplastic member 45 is made of, for example, rubber such as natural rubber and synthetic rubber, plastic material such as thermoplastic resin, or wax.

As shown in FIG. 8C, the chip 41 with the sealing member 42 is dipped in the melted thermoplastic member 45. Then, a dicing surface 41b, i.e., an outer sidewall of the chip 41 contacts the melted thermoplastic member 45. Then, the melted thermoplastic member 45 is adhered to the dicing surface 41b so that all dicing surface 41b is covered with the melted thermoplastic member 45.

Then, the chip 41 having the thermoplastic member 45 attached thereon is retrieved from the melted thermoplastic member 45, i.e., the chip 41 is pulled up from the container 43. The thermoplastic member 45 is cooled and hardened so that the dicing surface 41b of the chip 41 is covered with the thermoplastic member 45.

Thus, after the chip 41 is separated from the wafer 10, the dicing surface 41b of the chip 41 is covered with the thermoplastic member 45. In this case, when the wafer 10 is cut and separated into the chips 41, the particle is removed from the cutting surface 41b of the chip 41. However, since the thermoplastic member 45 covers the dicing surface 41b just after the chip 41 is separated from the wafer 10, the particle is limited from adhering to the dicing surface 41b of the chip 41.

In the above method, the sealing member 42 seals the surface 41a of the chip 41, and the chip 41 is dipped into the melted thermoplastic member 45. Accordingly, the thermoplastic member 45 is not adhered to the surface 41a of the chip 41, so that the semiconductor device in the device forming region 10c is not deteriorated by the thermoplastic member 45.

Alternatively, if the thermoplastic member 45 does not deteriorate the semiconductor device in the device forming region 10c, the sealing member 42 may not be necessary.

Although the member 45 is made of thermoplastic material, the member 45 may be made of thermosetting material. In this case, in a case where the thermosetting material is in a solid phase at a room temperature, and the thermosetting material is in a liquid phase or a gel state at a predetermined temperature higher than the room temperature, the member 12 made of thermosetting material is heated when the member 45 is accommodated in the container 43.

In a case where the thermosetting material is in a liquid phase, or a gel state at a room temperature, it is not required for the member 45 made of thermosetting material to heat when the member 45 is accommodated in the container 43. Accordingly, the electric heater 44 is not necessary. After the chip 41 is pulled from the melted member 45, the chip 41 with the member 45 made of thermosetting material is heated so that the member 45 covers the dicing surface 41b of the chip 41.

In the above case, the thermosetting material is made of any material as long as the material has thermosetting character. The thermosetting material is made of, for example, rubber such as synthetic rubber, plastic material such as thermosetting resin, or wax.

Although the member 45 is made of thermoplastic material, the member 45 may be made of photosensitive material. In this case, it is not required for the member 45 to heat up in the container 43. Accordingly, the electric heater 44 is not necessary. After the chip 41 is pulled from the melted member 45, the member 45 made of thermosetting material is irradiated with the light so that the member 45 is hardened. Thus, the member 45 covers the dicing surface 41b of the chip 41. The photosensitive material may be any material as long as the material has photosensitivity. For example, the photosensitive material is plastic material such as photosensitive resin.

Although the member 45 is made of thermoplastic material, the member 45 may be made of chemical reaction curable material, catalytic curable material, solvent evaporation curable material, or solvent dry curable material. In this case, it is not required for the member 45 to heat up in the container 43. Accordingly, the electric heater 44 is not necessary. After the chip 41 is pulled from the melted member 45, a predetermined time passes. During the predetermined time, the chemical reaction hardening, catalytic hardening, solvent evaporation hardening, or solvent dry hardening is performed. Thus, the member 45 covers the dicing surface 41b. The chemical reaction curable material, catalytic curable material, solvent evaporation curable material, or solvent dry curable material is made of any material as long as the material is chemical reaction curable, catalytic curable, solvent evaporation curable, or solvent dry curable. The chemical reaction curable material, catalytic curable material, solvent evaporation curable material, or solvent dry curable material is made of, for example, rubber such as synthetic rubber or plastic material. The chemical reaction curable material is, for example, cyanocrylate series resin or two-solution type epoxy resin, which is hardened with water on a surface as catalyst.

In this embodiment, after the member 45 covers the dicing surface 41b of the chip 41, the member 45 is hardened. Alternatively, in a case where it is not necessary for the member 45 covering the dicing surface 41b to be hardened in a post process such as a mounting process, a bonding process and a resin sealing process after the wafer 10 is separated, the member 45 may maintain to be melted after the wafer 10 is separated. Specifically, without hardening the melted member 45, the dicing surface 41b is covered with the melted member 45. In this case, it is not requested for the member 45 to have curability. Thus, after the member 45 is heated and melted, the member 45 may be in a liquid phase or a gel state even at a room temperature.

Although the wafer 10 is cut and separated by using the reforming portions R in the wafer formed by the laser dicing method, the wafer may be separated by another method such as a blade dicing method. Specifically, since a step for protecting the semiconductor device from the particle is performed after the wafer is separated into the chips, a separation method of the wafer 10 is not limited to a laser dicing method. Thus, the wafer 10 may be cut by a dicing blade, which rotates with high speed. The dicing blade has a diamond abrasive grain embedded in the blade.

Fifth Embodiment

Figure 9A:
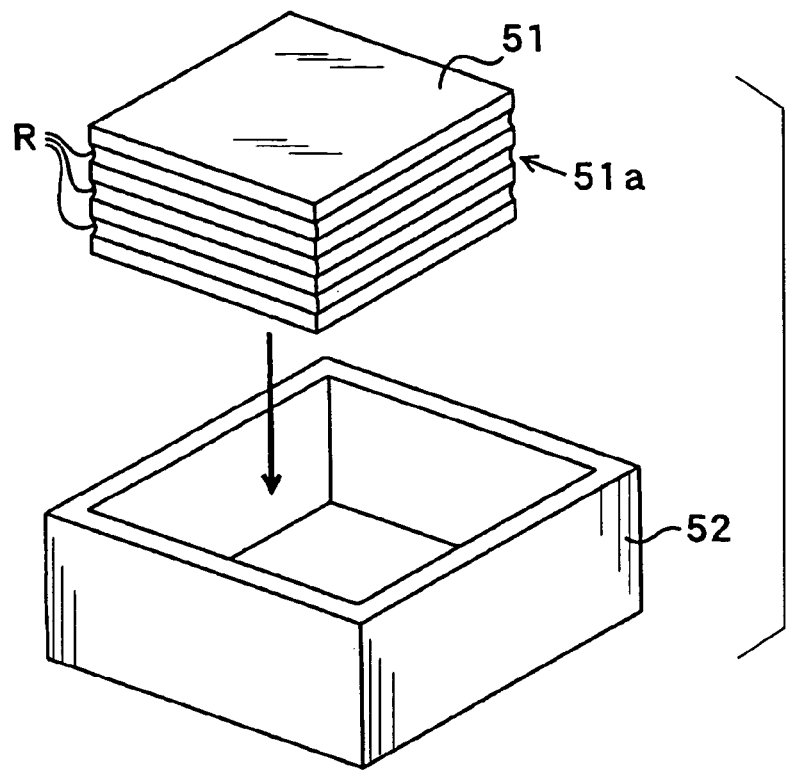
FIGS. 9A to 9C are schematic views explaining another method for processing a chip.
Figure 9B:
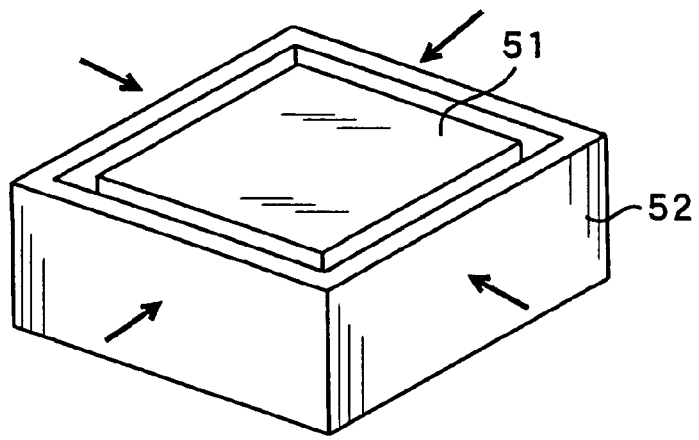
Figure 9C:
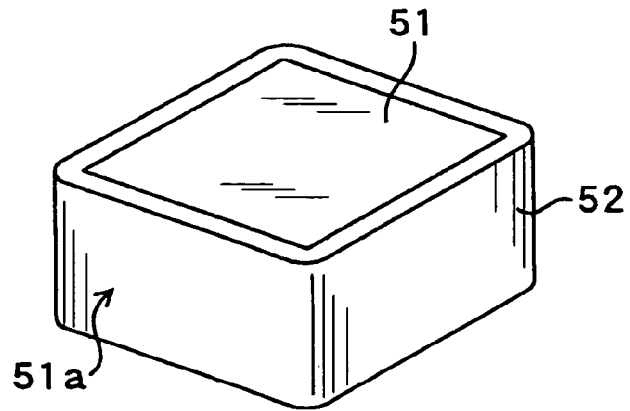

FIGS. 9A to 9C show a method for processing the chip 41. In the method, the reforming portions R are formed in the wafer by using a laser dicing method. Then, the wafer 10 is cut and separated from the reforming portions R as the starting point of dicing. In the wafer 10, no thermoplastic member 12 is formed on the part 10e of the wafer 10.

As shown in FIGS. 9A to 9C, the chip 41 is inserted into a thermoplastic casing 52, which has a square tube shape and formed from, for example, a film.

As shown in FIG. 9B, the thermoplastic casing 52 is heated so that the thermoplastic casing shrinks. Thus, the thermoplastic casing 52 adheres to the dicing surface 41b of the chip 41.

As shown in FIG. 9C, after the thermoplastic casing 52 covers the dicing surface 41a of the chip 41, the thermoplastic casing 52 is cooled.

Thus, the thermoplastic casing 52 is hardened together with covering the dicing surface 41b.

Thus, after the chip 41 is separated from the wafer 10, the dicing surface 41b of the chip 41 is covered with the thermoplastic casing 52. In this case, when the wafer 10 is cut and separated into the chips 41, the particle is removed from the cutting surface 41b of the chip 41. However, since the thermoplastic casing 52 covers the dicing surface 41b just after the chip 41 is separated from the wafer 10, the particle is limited from adhering to the dicing surface 41b of the chip 41.

The dimensions of the thermoplastic casing 52 are determined appropriately on the basis of the dimensions of the chip 41, the material of the casing 52, and/or the like. Specifically, the dimensions of the casing may be determined experimentally.

The casing 52 is made of, for example, rubber such as natural rubber and synthetic rubber, plastic material such as thermoplastic resin, or wax.

Although the casing 52 is made of thermoplastic material, the casing 52 may be made of photo shrinkage material. In this case, after the chip 41 is inserted into the casing 52, a light such as a visible light or a ultraviolet light is irradiated on the casing 52 so that the casing 52 shrinks. Thus, the casing 52 adheres to the dicing surface 41a of the chip 41. The photo shrinkage material may be made of any material as long as the material has photo shrinkage characteristic. For example, the photo shrinkage material is rubber such as synthetic rubber or plastic material such as thermoplastic resin.

Although the casing 52 is made of thermoplastic material, the casing 52 may be made of elastic material. In this case, a tensile stress is applied to the casing 52 so that the opening of the casing 52 expands. Then, the chip 41 is inserted into the opening of the casing 52. Then, the tensile stress is released so that the casing shrinks. Thus, the casing 52 adheres to the dicing surface 41a of the chip 41. The elastic material may be made of any material as long as the material has elasticity. For example, the elastic material is rubber such as synthetic rubber or plastic material such as thermoplastic resin.

Although the wafer 10 is cut and separated by using the reforming portions R in the wafer formed by the laser dicing method, the wafer may be separated by another method such as a blade dicing method. Specifically, since a step for protecting the semiconductor device from the particle is performed after the wafer is separated into the chips, a separation method of the wafer 10 is not limited to a laser dicing method. Thus, the wafer 10 may be cut by a dicing blade, which rotates with high speed. The dicing blade has a diamond abrasive grain embedded in the blade.

Sixth Embodiment

Figure 25:
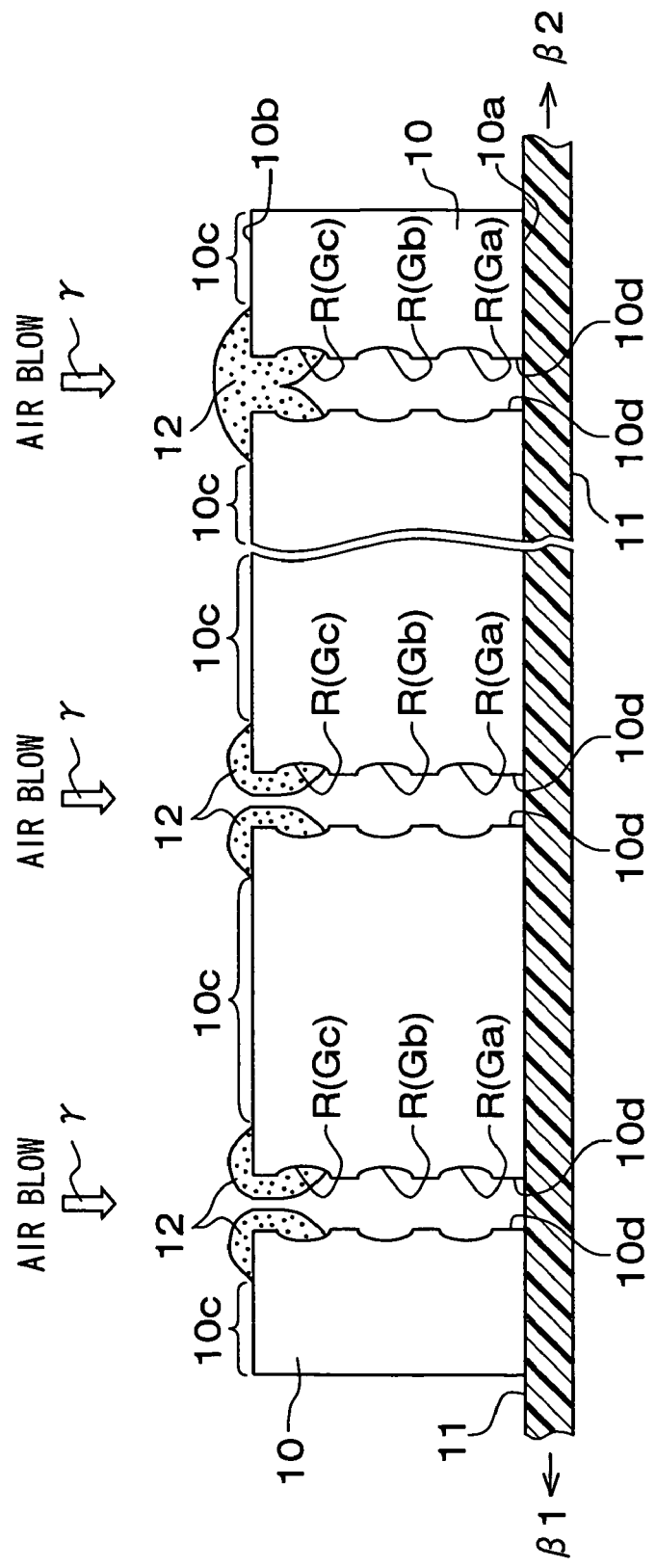
FIG. 25 is a cross sectional view explaining another method for processing a wafer with a laser beam.

FIG. 25 shows a method for processing the wafer 10. Specifically, the wafer 10 is separated and diced.

In FIG. 25, the dicing film 11 is expanded in the horizontal direction β1, β2 so that the tensile stress is applied to the reforming groups Ga-Gc. Accordingly, the wafer 10 is separated from the reforming groups Ga-Gc as the starting point of cutting. At this time, the wafer 10 is arranged horizontally in such a manner that the foreside 10b of the wafer 10 turns upward, and the wafer 10 is heated. Thus, the melted thermoplastic member 12 falls down along with the dicing surface 10d when the wafer 10 is separated.

When the wafer 10 is separated, an air blower (not shown) blows air to the foreside 10b of the wafer 10 in a vertical direction γ. The air amount is appropriate so that an air pressure is applied to the melted thermoplastic member 12 having the low viscosity and high fluidity. By the air pressure and the gravity, the thermoplastic member 12 immediately falls down along with the dicing surface 10d of the wafer 10, so that the thermoplastic member 12 adheres to the dicing surface 10d and covers whole dicing surface 10d immediately.

Accordingly, the thermoplastic member 12 can cover the dicing surface 10d of the wafer 10 quicker than a case where the thermoplastic member 12 falls down by using only the gravity.

Here, the air amount of the air blow blowing toward the foreside 10b of the wafer 10 is controlled appropriately in such a manner that the thermoplastic member 12 falls down without damaging a semiconductor element such as a monolithic IC, various semiconductor parts, a sensing element formed by using a MEMS technique and a micro-machine, which is formed on the device forming region 10c on the foreside 10b of the wafer 10. Specifically, a preferable air amount of the air blow is determined experimentally.

The direction of the air blow toward the foreside 10b of the wafer 10 is perpendicular to the wafer 10. Alternatively, a preferable direction of the air blow toward the foreside 10b may be determined experimentally.

Although the air blow provides the air pressure on the foreside 10b of the wafer 10, pressure may be directly applied to the thermoplastic member 12, which is melted and heated, so that the thermoplastic member 12 falls down along with the dicing surface 10d when the wafer 10 is cut and separated by expanding the dicing film 11.

For example, the wafer 10 is arranged in a pressure chamber. Then, the pressure in the chamber is increased, so that the pressure is applied to the thermoplastic member 12. Here, preferable pressure of the thermoplastic member 12 is experimentally determined.

Seventh Embodiment

Figure 26:
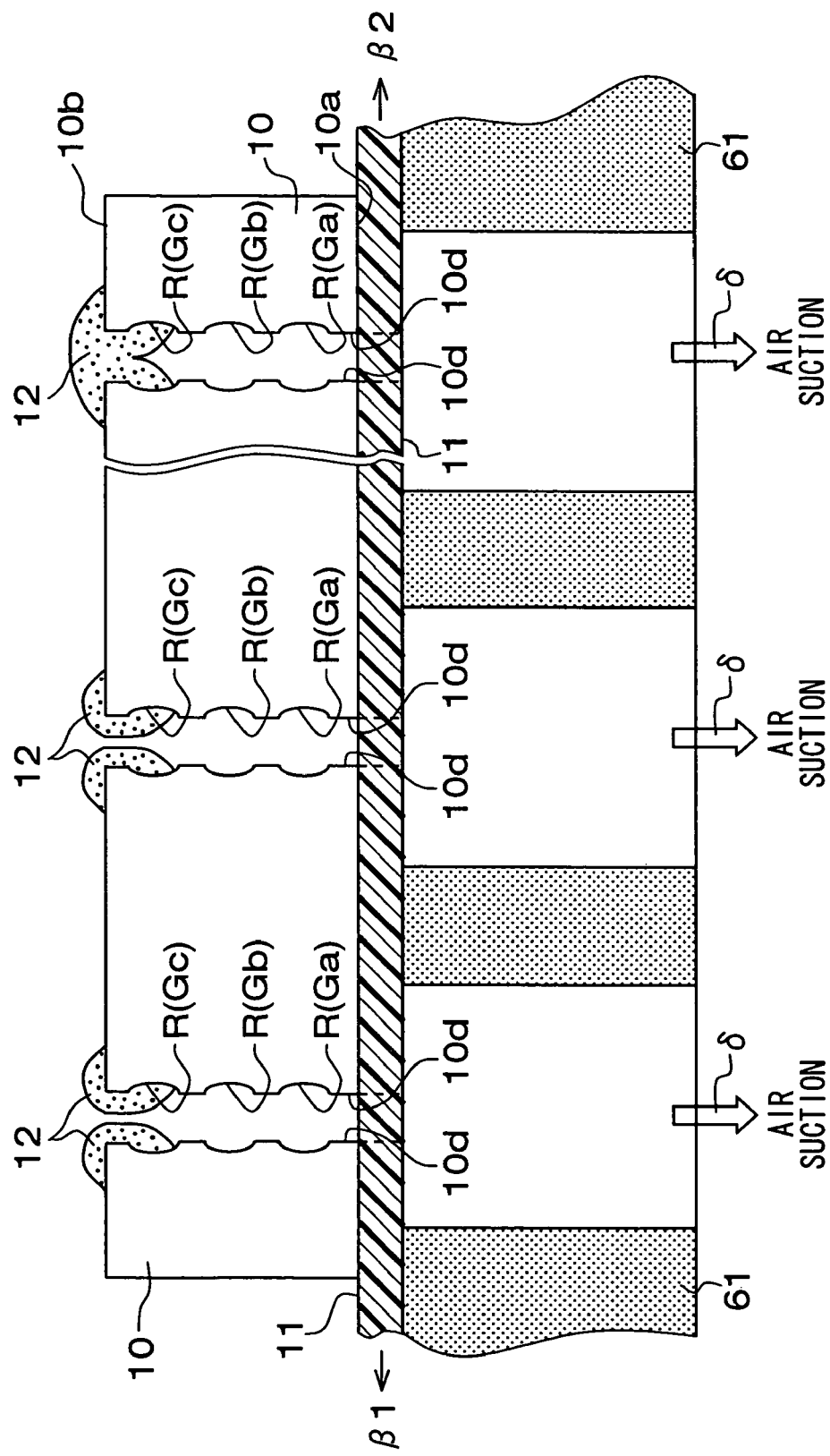
FIG. 26 is a cross sectional view explaining further another method for processing a wafer with a laser beam.

FIG. 26 shows a method for processing the wafer 10. Specifically, the wafer 10 is separated and diced.

In FIG. 26, the dicing film 11 has expansibility so that the dicing film 11 is expansible in accordance with heat or tensile stress in an expansible direction. Further, the dicing film 11 has air permeability. For example, the dicing film 11 is made of plastic film so that multiple fine pores penetrate the dicing film 11 in a thickness direction.

The wafer 10 attached with the dicing film 11 is mounted on an expand stage, i.e., a dicing stage 61. The dicing stage 61 has a lattice shape so that the dicing stage 61 has air permeability.

When the dicing film 11 is expanded so that the wafer 10 is separated, a suction pump (not shown) sucks the air from a backside of the dicing stage 61 through the dicing film 11 so that a suction force in a direction δ is applied to the wafer 10. Specifically, the suction force is applied to a cutting part of the wafer 10, which corresponds to the dicing surface 10d.

When the suction force is applied to the cutting part of the wafer 10 from the downside of the wafer 10, the suction force is also applied to the melted thermoplastic member 12, which has low viscosity and high fluidity. By the suction force and the gravity, the thermoplastic member 12 immediately falls down along with the dicing surface 10d of the wafer 10, so that the thermoplastic member 12 adheres to the dicing surface 10d and covers whole dicing surface 10d immediately.

Accordingly, the thermoplastic member 12 can cover the dicing surface 10d of the wafer 10 quicker than a case where the thermoplastic member 12 falls down by using only the gravity.

Here, the suction force is controlled appropriately in such a manner that the thermoplastic member 12 falls down without damaging a semiconductor element, which is formed on the device forming region 10c on the foreside 10b of the wafer 10. Specifically, a preferable suction force is determined experimentally.

Although the dicing stage 61 has the lattice shape in order to have the air permeability, the dicing stage 61 may be made of a porous material. Alternatively, the dicing stage 61 may have a mesh structure.

As shown in FIG. 27, the dicing stage 61 may have a through hole 61a, which is slight smaller than the wafer 10. The periphery of the wafer 10 is mounted on a periphery of the dicing stage 61, i.e., a sidewall of the through hole 61a so that the wafer 10 is mounted on the dicing stage 61.

Eighth Embodiment

Figure 10A:
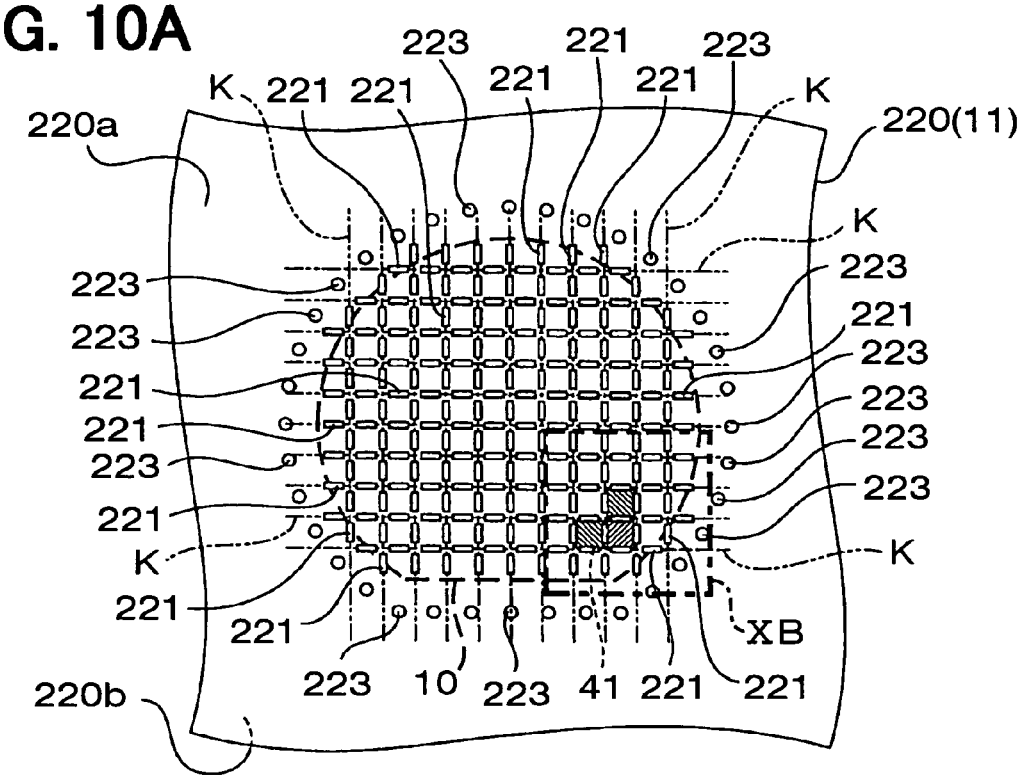
FIG. 10A is a plan view showing an expand tape together with a wafer.

FIGS. 10A to 13D show a method for dicing a wafer with using a dicing film. In FIG. 10A, the dicing film is formed of an expand tape 220. The expand tape 220 is made of, for example, resin sheet such as a vinyl chloride film. The expand tape 220 has elasticity. Adhesive member is applied on one side 220a of the expand tape 220. The adhesive member bonds between the wafer 10 and the expand tape 220. The other side 220b of the expand tape 220 has no adhesive member. However, a surface treatment is performed on the other side 220b of the expand tape 220 so that a particle 200, 201 absorbed by an absorber is prevented from adhering to the other side 220b of the expand tape 220. The wafer 10 corresponds to a processing object, and the semiconductor chip 41 corresponds to a divided piece.

Figure 10B:
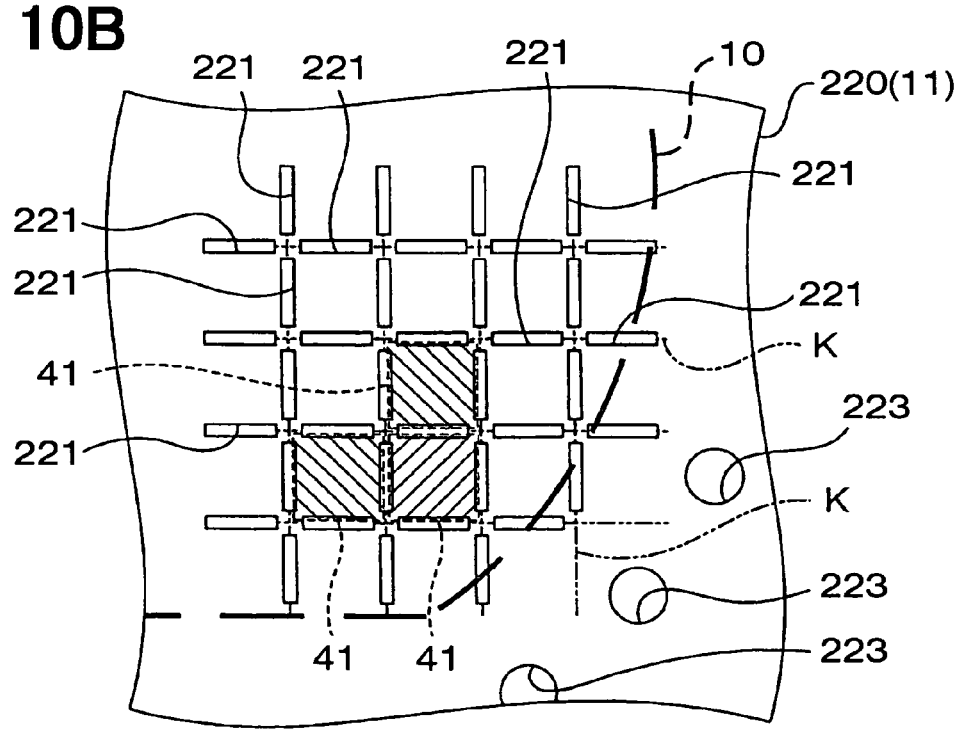
FIG. 10B is a partially enlarged plan view showing a part XB of the tape in FIG. 10A.

The expand tape 220 includes a first hole 221 and a second hole 223. The first hole 221 has a rectangular shape, and the second hole 223 has a circular shape. The wafer 10 has an orientation flat OF, which is a notch for determining a position of the wafer 10. Thus, the orientation flat OF shows a position for bonding the wafer on the expand tape 220. The wafer position is defined as the orientation flat OF. The cutting line K is a line for the wafer 10 to be cut at the cutting line K. Thus, the wafer 10 is diced at the cutting line K. Although three semiconductor chips 41 are shown in FIG. 10B, multiple chips 41 are disposed on all surface of the wafer 10.

The first hole 221 of the expand tape 220 is formed along with the cutting line K of the wafer 10. The first hole 221 penetrates the expand tape 220. FIG. 10B shows a part XB of the wafer 10 with the expand tape 220. The first hole 221 is formed in accordance with a periphery of the chip 41, and disposed within the periphery of the wafer 10. Here, the chip 41 has a square shape having four sides, each of which corresponds to the first hole 221. Four first holes 221 corresponding to four sides of the chip 41 are not connected together. Thus, the first hole 221 provides a discontinuous hole.

When four first holes 221 are connected together, i.e., the first hole 221 surrounds the chip completely, the expand tape 220 surrounded with the hole 221 is removed from the expand tape 220. Accordingly, at four corners among the first holes 221, the holes 221 are not connected.

The second hole 223 is disposed outside of the wafer 10, and penetrates the expand tape 220. Thus, a whole shape of multiple first holes 221 provides a circular shape with a notch, and a whole shape of second holes 223 provides a circle with a notch, which is disposed outside of the first holes 221.

In FIG. 10A, the second holes 223 are disposed on a circle, which is a slight larger than the outer periphery, i.e., the outline of the wafer 10. The second holes 223 are disposed on the circle by a predetermined interval, which is defined by a center angle of 10 degrees. Thus, thirty-six circular holes are formed on the circle.

The dimensions of the first hole 221 and the dimensions of the second hole 223 are determined that the chip 41 does not pass through the hole 221, 223. Specifically, the maximum dimension of each hole 221, 223 is smaller than a short side of the chip 41.

Figure 11A:
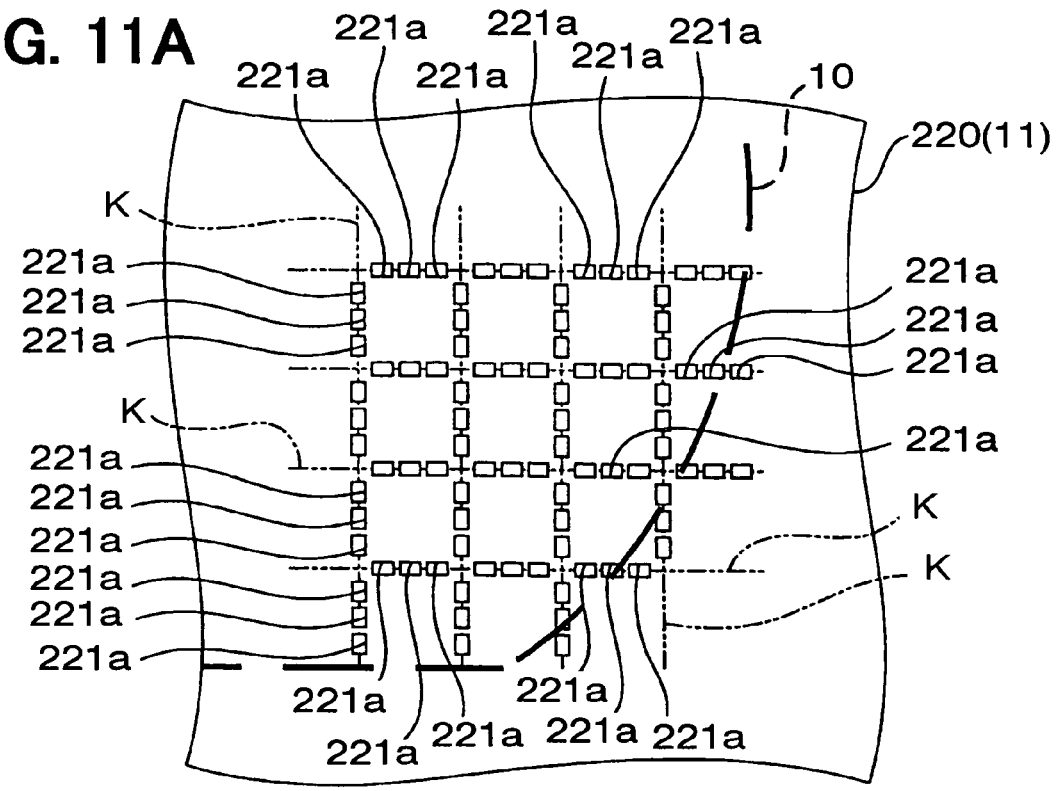
FIGS. 11A and 11B are partially enlarged plan views showing other expand tapes.

FIG. 11A shows another first hole 221a in the expand tape 220 as a modification of the expand tape 220 in FIGS. 10A and 10B. The first hole 221 in FIG. 11A includes three rectangular holes 221a, which are disconnected together. Specifically, the length of the first hole in FIG. 10A is about three times larger than the length of each rectangular hole 221a in FIG. 11A. Specifically, three rectangular holes 221a have the same rectangular shape, and arranged on the cutting line of the wafer 10. Thus, the three rectangular holes 221a are arranged tandemly in a longitudinal direction of the rectangular holes 221a. The three rectangular holes 221a correspond to the first hole 221. When the expand tape 220 includes three rectangular holes 221a, a total hole area of the expand tape 220 is smaller than that in a case where the expand tape 220 includes the first hole 221. Thus, the tensile stress of the expand tape 220 preferably transmits to the wafer 10.

Figure 11B:
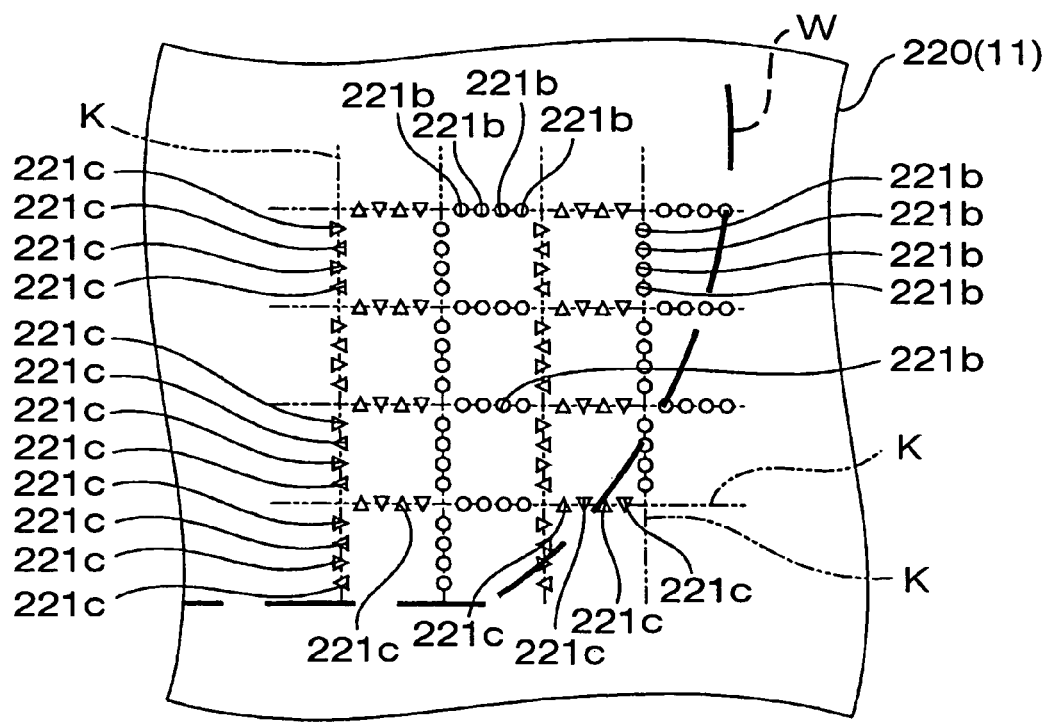

FIG. 11B shows further another first hole 221b, 221c in the expand tape 220 as a modification of the expand tape 220 in FIGS. 10A and 10B. The first hole 221b, 221c includes a circular hole 221b and a triangle hole 221c. In FIG. 11B, four circular holes 221b are arranged on one side of the chip 41, and four triangle holes 221c are arranged on another one side of the chip 41. Thus, four circular holes 221b provide one of the first holes 221, and four triangle holes 221c also provide another one of the first holes 221. Four triangle holes 221c are disconnected together, and four circular holes 221b are also disconnected together.

In this case, the diameter of the circular hole 221b is about one-fourth of the length of the first hole 221. Four circular holes 221b are disposed on one side of the chip 41 and on the cutting line K. The dimension of the triangle hole 221c is about one-fourth of the length of the first hole 221. Four triangle holes 221c are disposed on another one side of the chip 41 and on the cutting line. Here, each one of four triangle holes 221c has a certain turn different from adjacent one of triangle holes 221c, so that four triangle holes 221c are alternately arranged on the cutting line. In this case, a total hole area of the expand tape 220 is smaller than that in a case where the expand tape 220 includes the first hole 221. Thus, the tensile stress of the expand tape 220 preferably transmits to the wafer 10.

Figure 12A:
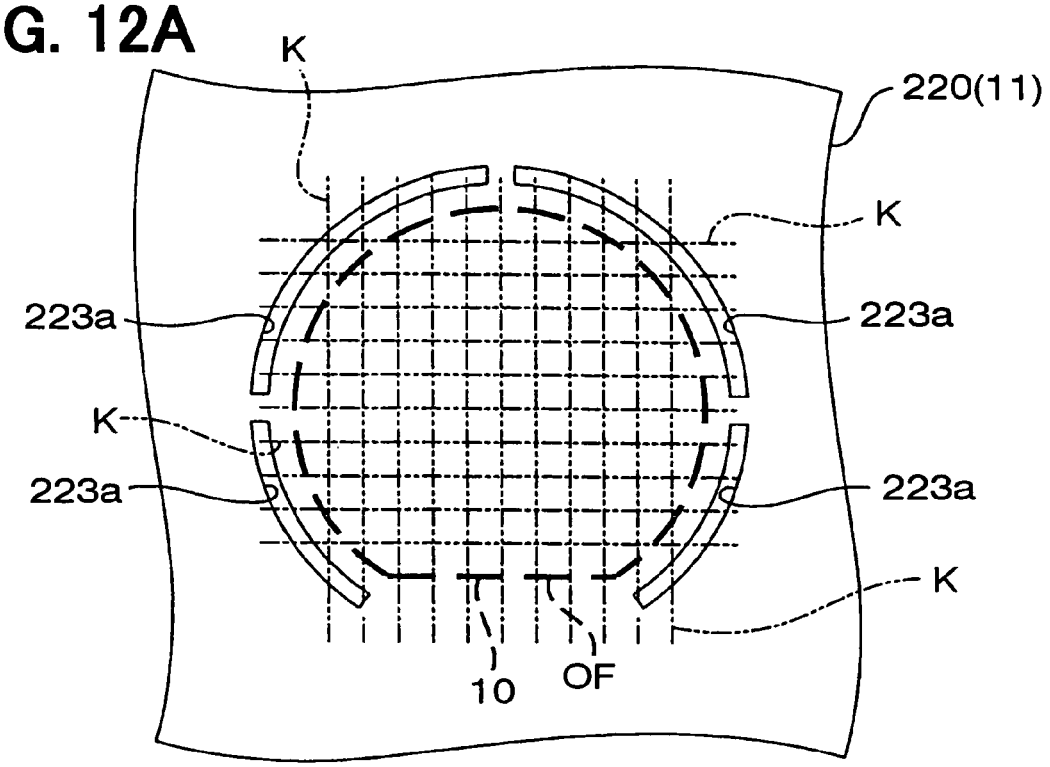
FIGS. 12A and 12B are plan views showing other expand tapes.

FIG. 12A shows another second hole 223a in the expand tape 220 as a modification of the expand tape 220 in FIGS. 10A and 10B. The expand tape 220 includes four arc holes 223a, which is disposed along with the periphery of the wafer 10. For example, each arc hole 223a corresponds to almost one-fourth of the circumference of the wafer 10. Four arc holes 223a are disconnected together, and disposed outside of the wafer 10. In FIG. 12A, a part corresponding to the orientation flat OF is removed from the arc holes 223a.

Thus, thirty-six second holes 223 shown in FIG. 10A can be replaced to four arc holes 223a. When the expand tape 220 includes four arc holes 223a, a total hole area of the expand tape 220 is increased, compared with thirty-six second holes 223. This is because each arc hole 223a has a large length, compared with each second hole 223. Thus, the particle 200 generated from the periphery of the wafer, i.e., the dicing surface of the wafer 10 in a case where the laser beam L is irradiated on the wafer 10 is sufficiently absorbed and retrieved through the arc holes 223a.

Figure 12B:
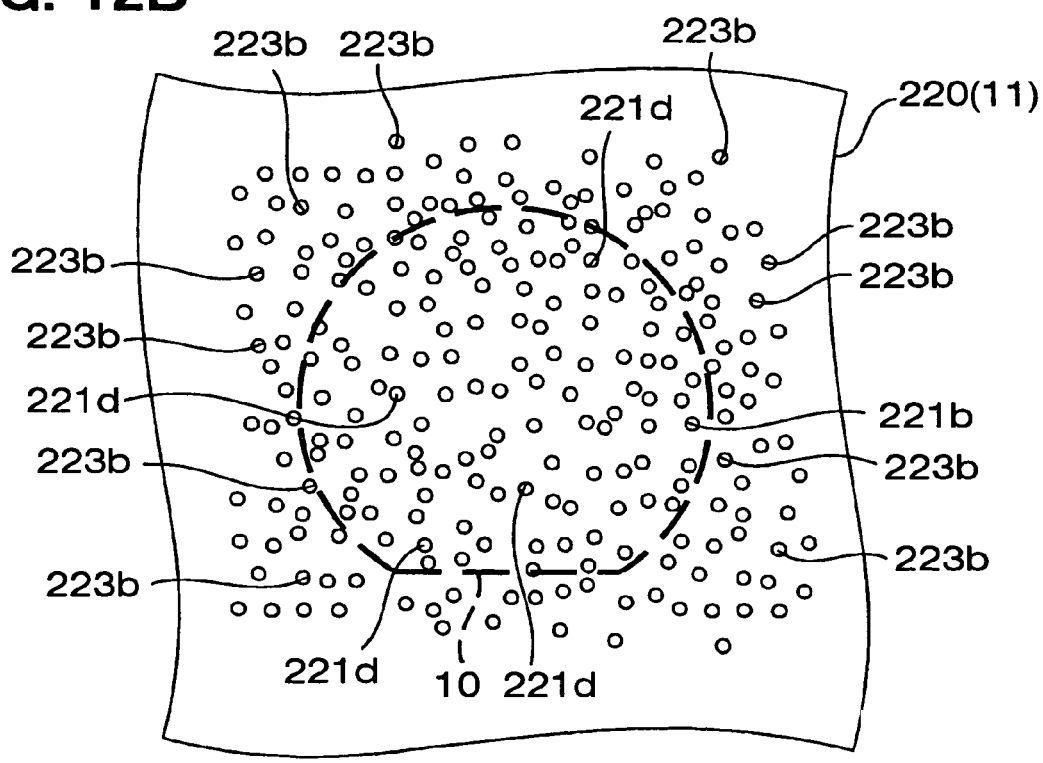

FIG. 12B shows another first hole 221d and another second hole 223b in the expand tape 220 as a modification of the expand tape 220 in FIGS. 10A and 10B. The first holes 221d and the second holes 223b are disposed on the expand tape 220 in a random manner. Each of the first and second holes 221d, 223b has a circular shape. The first holes 221d are disposed within the wafer 10, and the second holes 223b are disposed outside of the wafer 10. Thus, the first and second holes 221d, 223b are dotted without regularity.

In the above case, the first holes 221d are not always disposed on the cutting line K, and the second holes 223b are not always disposed along with the periphery of the wafer 10. Thus, the particle 200, 201 is absorbed through the first and second holes 221d, 223b. Absorption efficiency of the particle 200, 201 is comparatively small, compared with the expand tape 220 shown in FIGS. 10A to 12A.

Although the planar shape and the position of each hole 221, 221a-221d, 223, 223a-223b are explained with reference to FIGS. 10A to 12B, FIGS. 13A to 13D explain the cross section of the holes 221, 221a-221d, 223, 223a-223b. Although in FIGS. 13A to 13D, the second hole 223 has a circular shape, the second hole may have a rectangular shape, triangle shape or a polygonal shape.

Figure 13A:
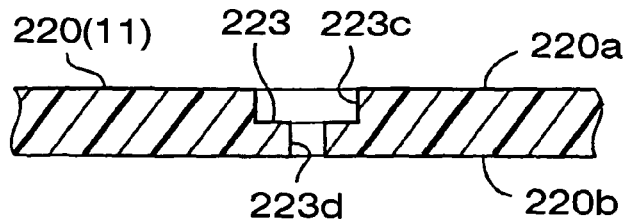
FIG. 13A is a cross sectional view showing a through hole in the expand tape taken along line IVA-IVA in FIG. 13B.
Figure 13B:
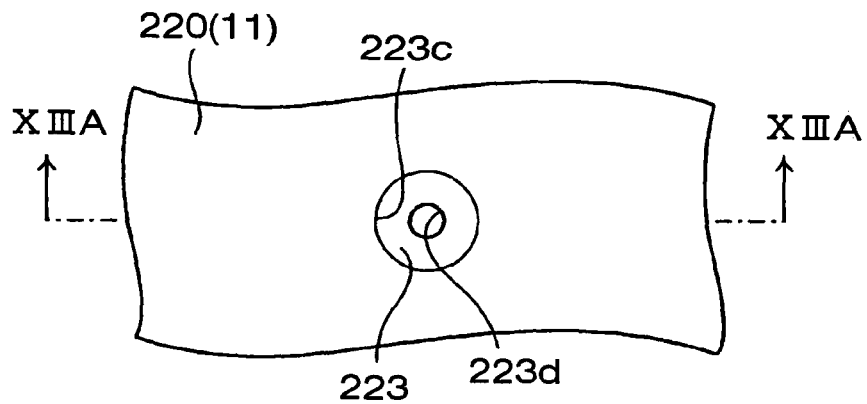
FIG. 13B is a partially enlarged plan view showing an expand tape.

In FIGS. 13A and 13B, the second hole 223 has a step so that the volume of the expand tape is maximized, i.e., the tensile stress of the expand tape 220 is sufficiently transmitted to the wafer 10. Specifically, the hoe area of the second hole 223 is minimized.

The one side 220a of the expand tape 220, on which the wafer 10 is bonded, has a large diameter hole 223c having a large inner diameter. The other side 220b of the expand tape 220, which is opposite to the wafer 10, has a small diameter hole 223d having a small inner diameter. Thus, the second hole 223 has the step.

In this case, the particle is absorbed through the large diameter hole 223c so that the particle within the opening of the large diameter hole 223c is sufficiently absorbed. Since the other side 220b has the small diameter hole 223d, the tensile stress of the expand tape 220 in a horizontal direction of the expand tape 220 is sufficiently transmitted to the wafer 10 through the expand tape 220. Specifically, the tensile stress is sufficiently transmitted to the inside of the expand tape.

Figure 13C:
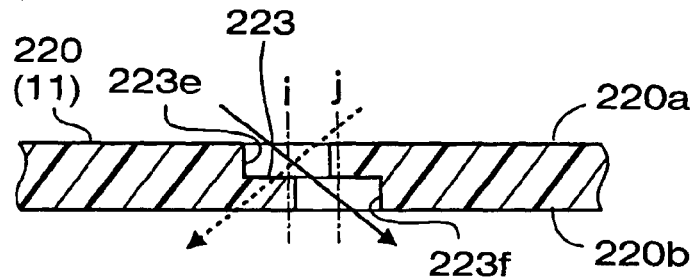
FIG. 13C is a cross sectional view showing another through hole in the expand tape taken along line IVC-IVC in FIG. 13D.
Figure 13D:
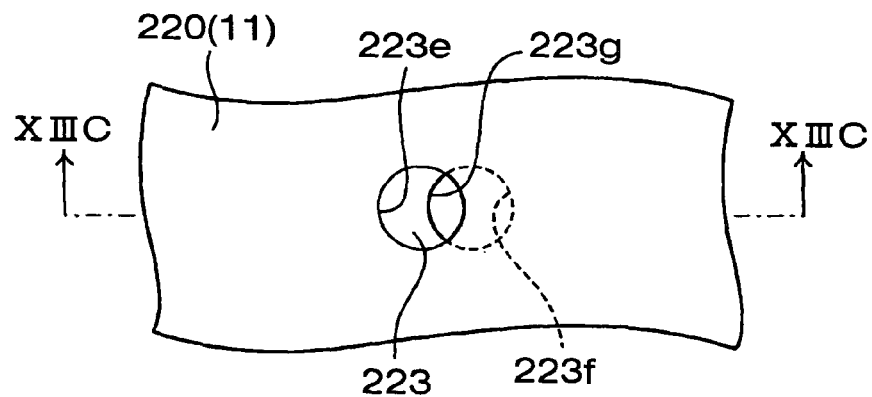
FIG. 13D is a partially enlarged plan view showing an expand tape.

In FIGS. 13C and 13D, the second hole 223 has an upper hole 223e and a lower hole 223f. The upper hole 223e has the center axis i, and the lower hole 223f has the other center j. The center i of the upper hole 223e is different from the center j of the lower hole 223f. The upper and lower holes 223e, 223f are overlapped so that an overlapping portion 223g is formed.

The upper hole 223e is opened on the one side 220a of the expand tape 220, and the lower hole 223f is opened on the other side 220b of the expand tape 220. Thus, the particle flowing along with the solid line shown in FIG. 13C can pass the expand tape 220 through the second hole 223. However, the particle flowing along with the dotted line shown in FIG. 13D cannot pass the expand tape 220. Thus, the second hole 223 having the upper and lower holes 223e, 223f can pass and prevent from passing the particle, so that an absorbing direction of the particle is controlled.

Thus, as described later, the particle generated from the dicing surface of the wafer 10 is absorbed from the one side 220a to the other side 220b of the expand tape 220 through the first and second holes 221, 223. Specifically, when the particle is absorbed from the foreside of the wafer 10 to the backside of the wafer 10 the air flow above the wafer 10 directs to the backside of the wafer 10. Thus, the air flow does not direct to the foreside of the wafer 10. Accordingly, the particle does not float above the wafer 10, compared with a case where the particle is absorbed toward the upward direction. Thus, the particle does not scatter on the wafer 10. The yielding ration and the quality of the semiconductor chip 41 are improved.

The first hole 221 shown in FIG. 10A and the rectangular holes 221a shown in FIG. 11A has a large opening area on the one side 220a of the expand tape 220, compared with the triangle holes 221b and the circular holes 221c shown in FIG. 11B, since they has a rectangular shape along with the periphery of the semiconductor chip 41. Further, the first hole 221 in FIG. 10A, the rectangular holes 221a in FIG. 11A and the triangle and circular holes 221b, 221c in FIG. 11B are disposed along with the periphery of the chip 41, the particle generated in a case where the wafer 10 is cut and separated is sufficiently absorbed to the other side 220b of the expand tape 220 through the holes 221, 221a, 221b, 221c, compared with a case where the first hole 221d is disposed on the expand tape in a random manner. Accordingly, the yielding ratio and the quality of the semiconductor chip is improved.

The second hole 223 shown in FIG. 10A and the arc hole 223a, shown in FIG. 12A are formed along with the periphery of the wafer 10. Accordingly, the particle scattered toward the outside of the wafer 10 can be absorbed through the hole 223, 223a to the other side 220b of the expand tape 220. For example, the particle 201 generated by laser abrasion in a case where the laser beam L is irradiated on the wafer 10 is absorbed through the hole 223, 223a. Accordingly, not only the particle generated from the dicing surface of the wafer 10 but also the particle generated by the laser abrasion can be absorbed to the other side 220b of the expand tape 220. Thus, the yielding ration and the quality of the chip are much improved.

Figure 15A:
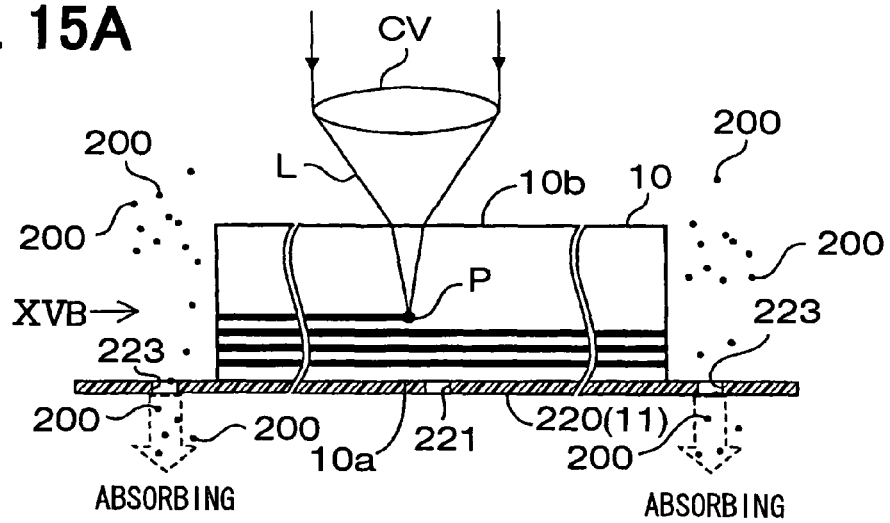
FIG. 15A is a schematic cross sectional view explaining a reforming step and a preliminary absorbing step in a laser dicing process.
Figure 15B:
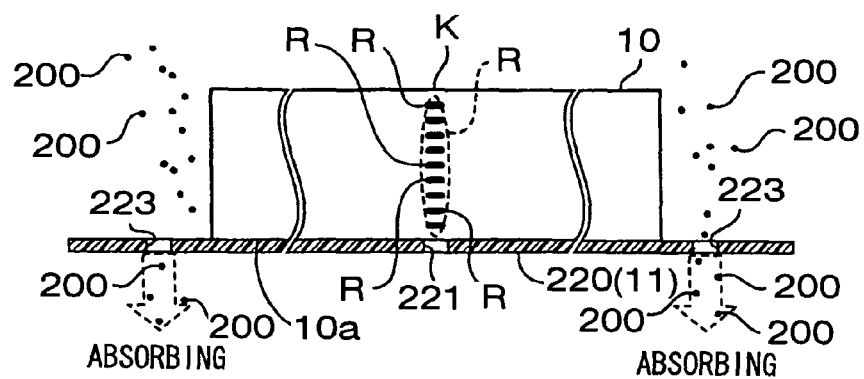
FIG. 15B is a cross sectional view showing the expand tape with the wafer viewing from a direction XVB in FIG. 15A.
Figure 15C:
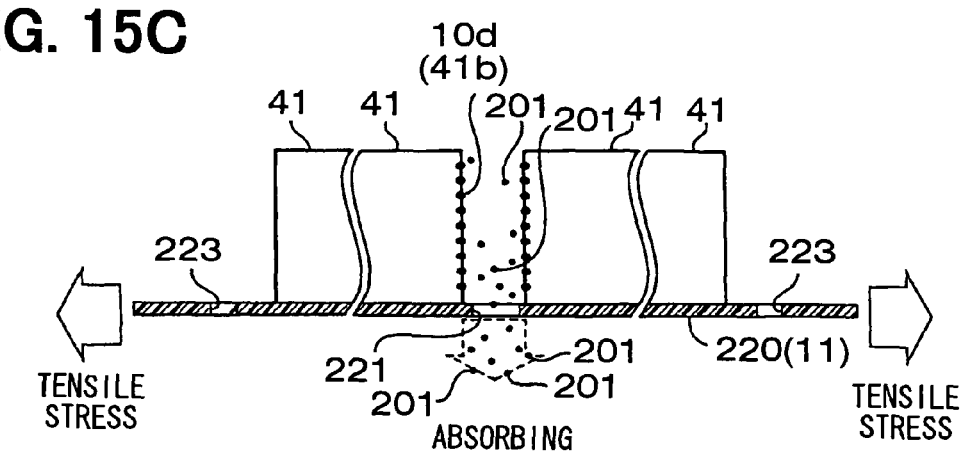
FIG. 15C is a schematic cross sectional view explaining a cutting step and an absorbing step in the laser dicing process.
Figure 16:
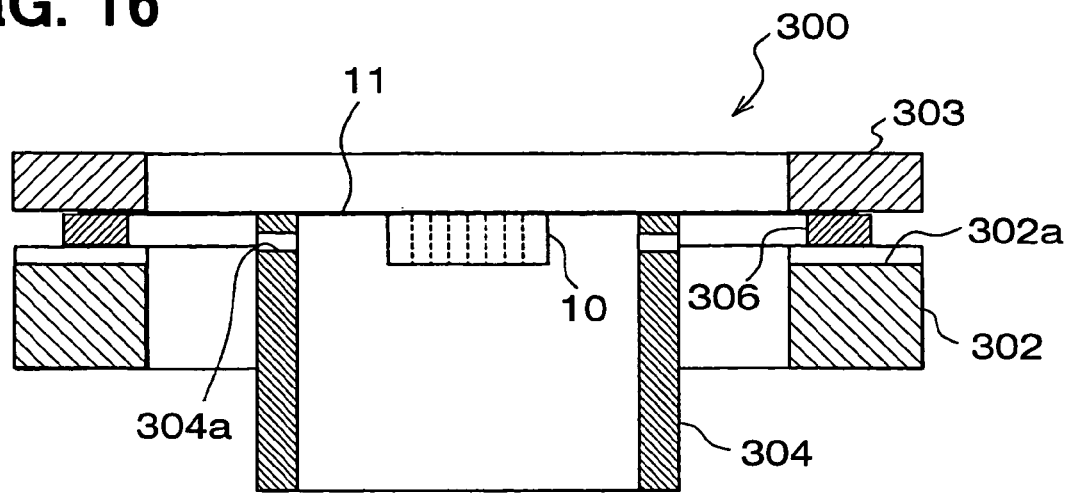
FIG. 16 is a cross sectional view showing an expand device.
Figure 17:
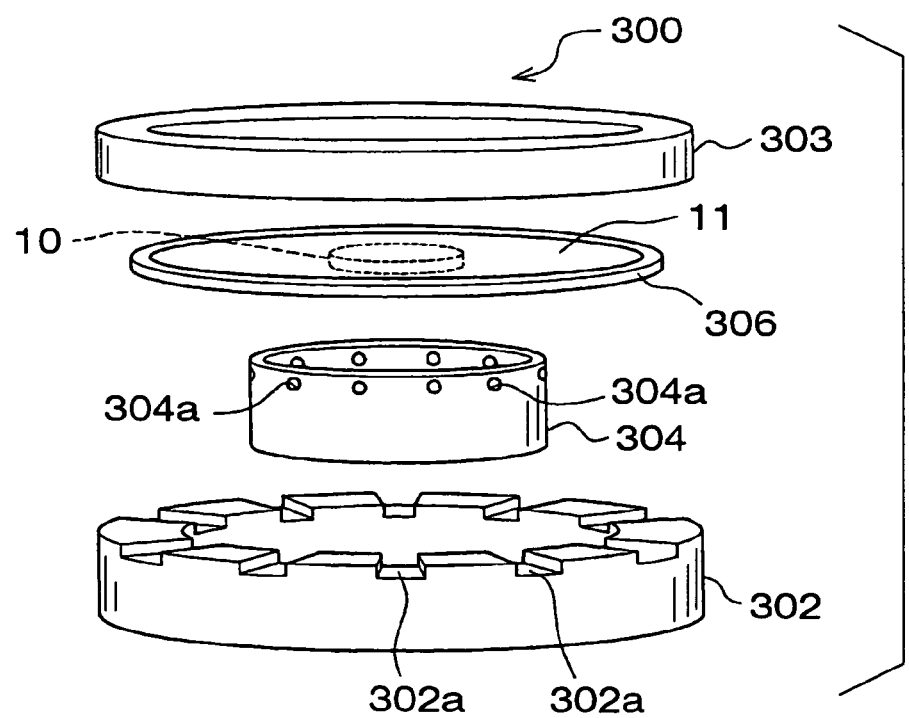
FIG. 17 is an exploded perspective view showing the expand device in FIG. 16.

The area of the arc hole 223a in FIG. 12A is larger than that of the second hole 223 in FIG. 10A, since the arc hole 223a formed along with the periphery of the wafer 10 has a large length. Thus, the opening area of the arc hole 223a is large. Further, since the arc hole 223a is formed along with the periphery of the wafer 10, the particle by the laser abrasion is sufficiently absorbed through the hole 223a to the other side 220b of the expand tape 220. Here, the wafer 10 is not adhered to the other side 220b of the expand tape 220. Accordingly, as shown in FIGS. 15A to 15C, the particle 200 generated by the laser abrasion and the particle generated from the dicing surface 10d of the wafer 10 are absorbed sufficiently.

Ninth Embodiment

Figure 14A:
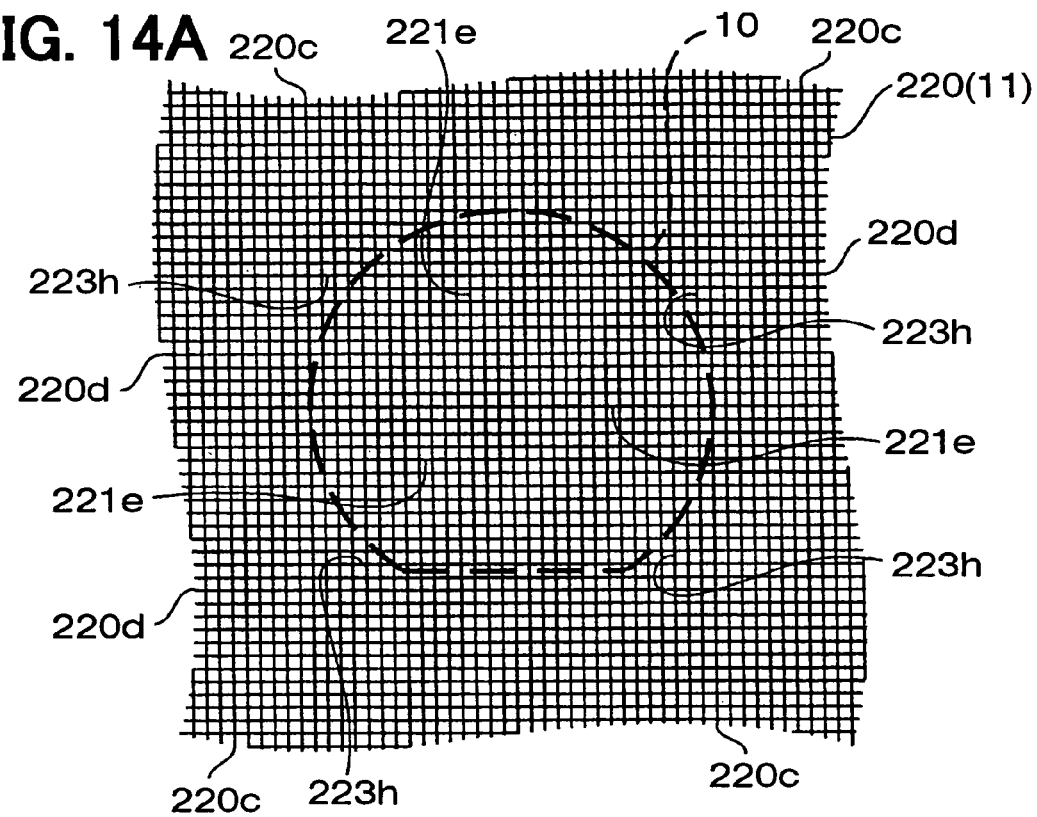
FIGS. 14A and 14B are plan views showing other expand tapes.
Figure 14B:
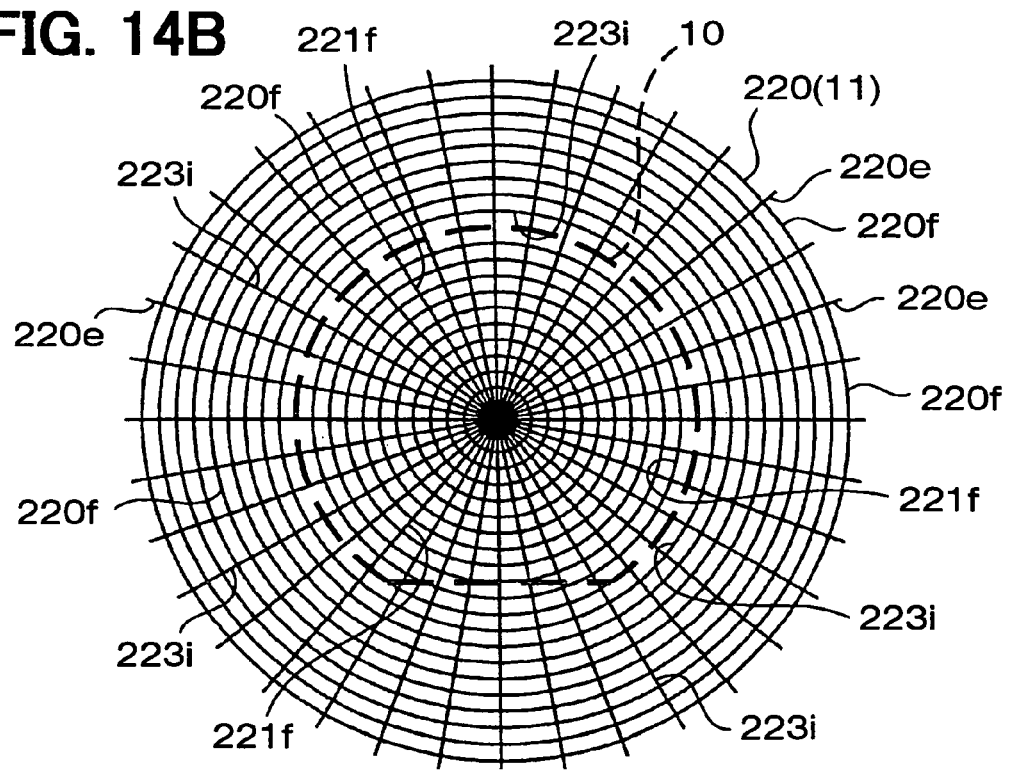

FIGS. 14A and 14B show expand tapes 220 having a mesh structure. Each expand tape 220 has elasticity, and the one side 220a of the expand tape 220 has adhesiveness so that the wafer 10 is capable of bonding on the one side 220a of the expand tape 220.

The area of each expand tape 220 corresponding to the wafer 10 has the mesh structure, and the other area of the expand tape 220 corresponding to the outside of the wafer 10 has also the mesh structure. Accordingly, the particle 200 generated by the laser abrasion and the particle generated from the dicing surface 10d of the wafer 10 are absorbed sufficiently through the mesh holes 221e, 221f, 223h, 223i to the other side 220b of the expand tape 220.

The mesh structure shown in FIG. 14A is a square lattice structure, which includes a longitudinal line 220c and a latitudinal line 220d. Thus, the tensile stress applied along with the longitudinal direction of the expand tape 200 is maintained, i.e., transmitted through the longitudinal line 220c, and the tensile stress applied along with the latitudinal direction of the expand tape 200 is maintained, i.e., transmitted through the latitudinal line 220d. A holder for holding the expand tape 220 is preferably a rectangular frame.

The mesh structure shown in FIG. 14B looks like a nest of a spider, which includes a radial line 220e and a circumferential line 220f. The radial line 220e expands from the center of the expand tape 220 toward the outside of the expand tape 220 in a radial pattern. The circumferential line 220f concentrically expands from the center of the expand tape 220. Thus, the tensile stress applied along with the radial direction from the center of the expand tape 220 is maintained, i.e., transmitted through the lines 220e, 220f. A holder for holding the expand tape 220 is preferably a circular frame.

Tenth Embodiment

A laser dicing process with using the expand tape 220 is shown in FIGS. 15A to 15C.

In FIG. 15A, the reforming portion R is formed by using the laser beam L. Specifically, the laser beam L is scanned along with the cutting line K of the wafer 10. Thus, the laser beam L is irradiated on the wafer 10 so that the reforming portion R is formed in the wafer 10 by the multiple photo absorption effect of the laser beam L. Thus, multiple layers provided by the reforming portion R are formed in the thickness direction of the wafer 10.

In FIG. 15C, the tensile stress is applied to the backside of the wafer 10 expand tape 220 through the expand tape 220. In this case, the expand tape 220 is expandable in the horizontal direction of the expand tape 220, so that the stress is transmitted to the wafer 10. Thus, the wafer 10 is pulled in the radial direction of the wafer 10. The wafer 10 is cut and separated from there forming portion R as the starting point of dicing.

An absorbing means such as a pump for applying a negative pressure to the expand tape 220, an airflow element for generating the airflow from the upside of the wafer 10 to the downside of the wafer 10, and an air blower for blowing the air from the upside of the wafer to the downside of the wafer 10 is disposed near the wafer 10. Thus, the particle 200 generated by the laser abrasion when the reforming portion R is formed in a laser irradiation process shown in FIG. 15A and the particle 201 generated from the dicing surface 10d of the wafer 10 when the wafer 10 is cut and separated are absorbed or blown from the one side 220a of the expand tape 220 to the other side 220b of the expand tape 220. Specifically, the particles 200, 201 are absorbed or blown through the hole 221 of the expand tape 220.

Thus, in an absorbing step, the air flow is generated by the absorbing means during the cutting step or after or before the cutting step. The particle 201 is absorbed from the foreside 10b to the backside 10a of the wafer 10 through the hole 223 of the expand tape 220. The air flow above the wafer 10 directs to the downward of the wafer 10; and therefore, the air flow is prevented from directing to the upward of the wafer 10. Accordingly, the particle 201 does not float above the wafer 10, and the particle 201 is not scattered on the wafer 10.

Further, in the step of forming the reforming portion R, or after or before the step of forming the reforming portion R, the absorbing means provides the air flow to the downward of the wafer 10. In this preliminary absorbing step, the particle 200 is absorbed to the backside 10a of the wafer 10 through the hole 223 of the expand tape 220. Here, the particle 200 is scattered to the outside of the wafer 10 when the laser beam L is irradiated on the wafer 10. Thus, the particle 200 is absorbed to the other side 220b of the expand tape 220 through the holes 221, 223. Accordingly, not only the particle 201 generated from the dicing surface of the wafer 10 but also the particle 200 generated by the laser abrasion can be absorbed to the other side 220b of the expand tape 220 through the holes 200, 201. Thus, the yielding ration and the quality of the chip are much improved.

Although the expand tape 220 is made of resin, the expand tape 220 may be made of another material as long as the expand tape 220 has air permeability. For example, a porous sheet, a multi-layered sheet may be used for the expand tape 220.

Eleventh Embodiment

FIGS. 16 to 20 show an expand device 300 for holding the wafer 10. The expand device 300 includes a mounting table 302, a mounting element 303, a spacer 304 and an absorbing device (not shown). The mounting table 302 has a cylindrical shape, and mounts a flat ring 306. The mounting element 303 has a ring shape, and fixes the flat ring 306. The spacer 304 has a cylindrical shape, and pushes the flat ring 306. The absorbing device absorbs the air in the spacer 304 toward the downward of the expand device 300. The top surface of the mounting table 302 includes multiple grooves 302a to connect the inside of the table 302 and the outside of the table 302.

The flat ring 306 is mounted on the table 302. The periphery of the dicing film 11 having a circular shape is bonded to the flat ring 306. The flat ring 306 is sandwiched between the table 302 and the mounting element 303 so that the flat ring 306 is fixed therebetween. The wafer 10 is bonded to the backside of the dicing film 11, and the semiconductor device is formed on one surface of the wafer 10.

The spacer 304 functions for pushing the dicing film 11 up. Thus, the spacer 304 is movable in a vertical direction, i.e., movable up and down. The spacer 304 pushes a part of the dicing film 11, which is disposed on the backside of the dicing film 11, and disposed outside of the wafer 10, so that the dicing film 11 is expanded. Thus, the wafer 10 is cut and separated into multiple chips 41. Multiple holes 304a are formed on an upside portion of the spacer 304. Each hole 304a penetrates the circumferential wall of the spacer 304 so that the inside and the outside of the spacer 304 are connected.

Figure 18A:
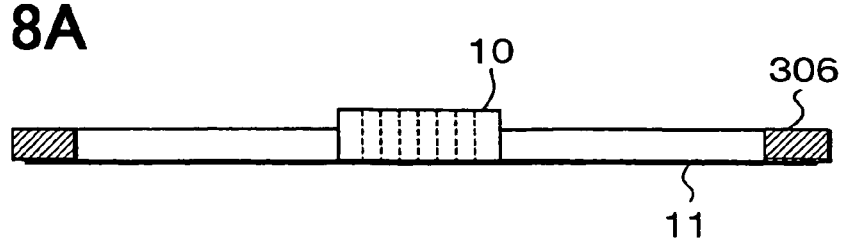
FIGS. 18A to 18D are cross sectional views explaining a dicing process with using the expand device.

FIGS. 18A to 18D explain a step of cutting the wafer 10. Firstly, as shown in FIG. 18A, the wafer 10 is bonded to almost center portion of the dicing film 11, which is mounted on the flat ring 306. Specifically, the dicing film 11 is mounted on the bottom of the flat ring 306, and the wafer 10 is bonded to the top surface of the dicing film 11. In this case, the semiconductor device on the wafer 10 is opposite to the dicing film 11 so that the semiconductor device does not contact the dicing film 11.

An adhesive member is applied on a part of the surface of the dicing film 11 in order to bond the wafer 10 thereon. The other part of the surface of the dicing film 11, on which the wafer 11 is not disposed, i.e., the other part which is disposed on the outside of the wafer 10, is processed for reducing the adhesiveness of the adhesive member. The spacer 304 is to contact the other part of the dicing film 11, and provides a ring shape around the wafer 10. Accordingly, the top surface of the spacer 304 is not bonded to the dicing film 11. Thus, the dicing film 11 is sufficiently expanded by the spacer 304. Here, if the other part of the dicing film 11 has adhesiveness, the dicing film 11 is prevented from expanding.

The process for reducing the adhesiveness is performed such that the dicing film 11 is made of an ultraviolet light radiation removal type dicing tape. In this case, an ultraviolet light is irradiated on the other part of the dicing film 11 so that the adhesiveness of the other part is reduced. This process for reducing the adhesiveness may be performed before the step of expanding the dicing film 11.

Figure 18B:
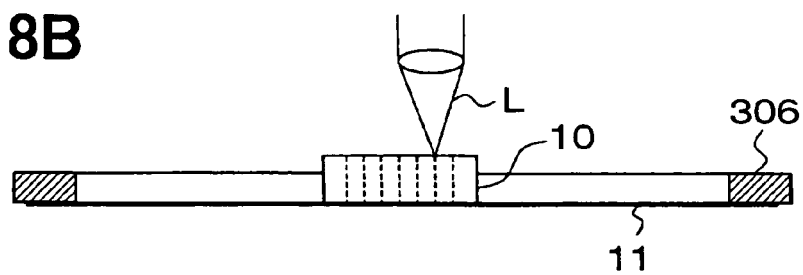

Next, as shown in FIG. 18B, the laser beam L is irradiated on the surface of the wafer 10 so that the reforming portion R for cutting the wafer 10 is formed in the wafer 10. A broken line in FIG. 18B represents the cutting line K.

Figure 18C:
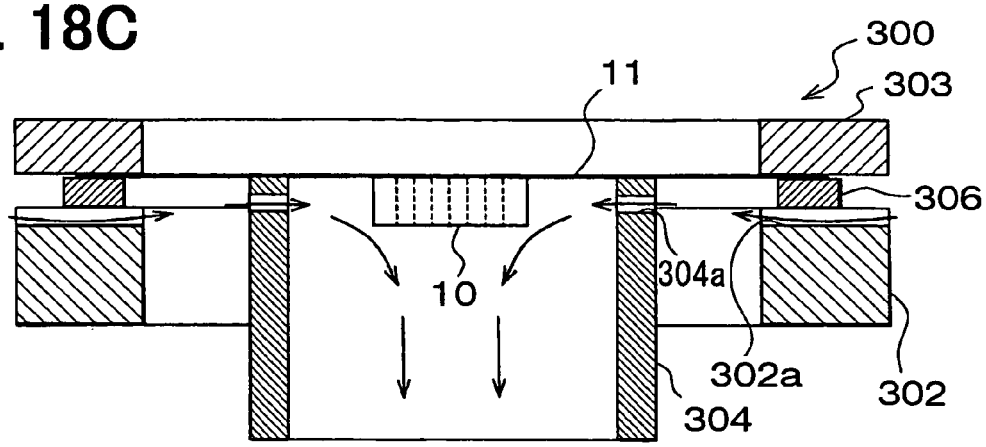

Then, as shown in FIG. 18C, the surface of the wafer 10, which is opposite to the dicing film 11, directs to the downward in the vertical direction, and the flat ring 306 with the dicing film 11 is mounted on the expand device 300. Specifically, the wafer 10 on the dicing film 11 turns over so that the wafer 10 faces the spacer 304. And, the periphery of the flat ring 306 is sandwiched between the mounting element 303 and the mounting table 302. Thus, the flat ring 306 with the dicing film 11 is fixed on the expand device 300. Further, the top surface of the spacer 304 pushes up and contacts the part of the dicing film 11, which is disposed outside of the wafer 10.

Then, the air absorbing device (not shown) is operated so that the air in the spacer 304 is absorbed downwardly. Thus, the air outside the expand device 300 is introduced into the spacer 304 from the groove 302a of the mounting table 302 and the hole 304a of the spacer 304. Then, the air in the spacer 304 flows from the surface of the wafer 10 to the downside of the spacer 304. Thus, the airflow from the surface of the wafer 10 to the downside of the spacer 304 is generated by the air absorbing device. Here, the groove 302a of the mounting table 302, the hole 304a of the spacer 304 and the absorbing device provide airflow generation equipment.

Figure 18D:
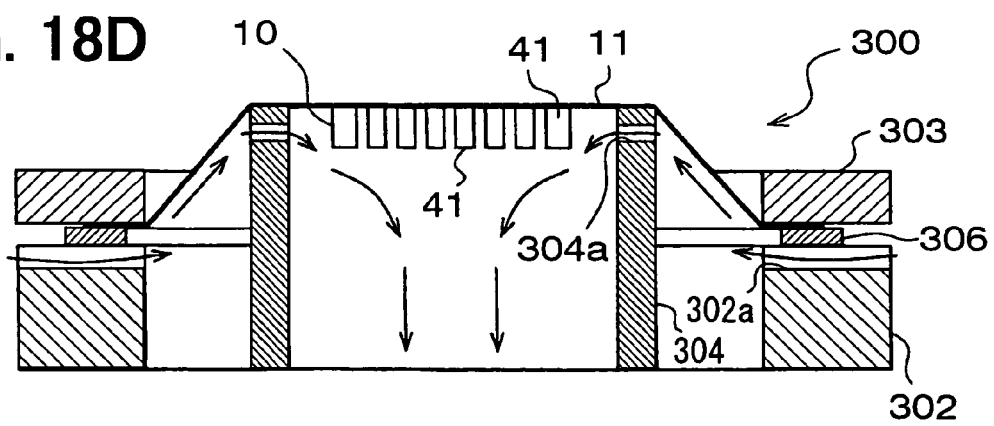
Figure 19:
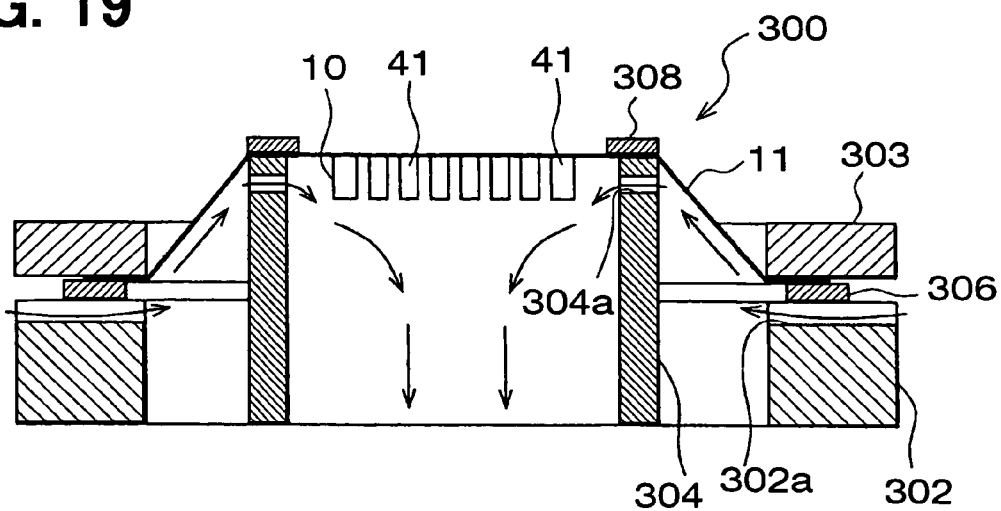
FIG. 19 is a cross sectional view explaining a step of mounting a second flat ring on a dicing film.

Then, as shown in FIG. 18D, the spacer 304 is elevated so that the top surface of the spacer 304 pushes the part of the dicing film 11 up. Thus, the dicing film 11 is expanded so that the wafer 10 is cut and separated into the chips 41. Here, when the wafer 10 is cut, the particle is generated from the dicing surface of the wafer 10. However, the particle falls freely since the wafer 10 directs downwardly. Accordingly, the particle does not adhere on the surface of the wafer 10. Specifically, since the airflow generation equipment generates the airflow so that the air in the spacer 304 is absorbed downwardly. Thus, the airflow from the surface of the wafer 10, which is opposite to the dicing film 11, to the downside of the spacer 304 carries the particle from the surface of the wafer 10 to the downside of the spacer 304. Thus, the particle does not float above the wafer 10, and does not adhere on the wafer 10. Then, as shown in FIG. 19, a second float ring 308 is bonded to the top surface of the dicing film 11. The second flat ring 308 has almost the same dimensions as the outer diameter of the spacer 304. Thus, the divided chips 41 maintain to be separated together. The outside of the dicing film 11 disposed outside of the second flat ring 308 is cut.

Figure 20:
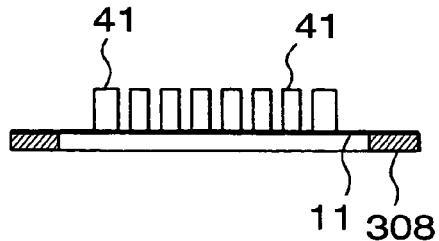
FIG. 20 is a cross sectional view showing the second flat ring with the dicing film.

Thus, as shown in FIG. 20, the chips 41 are divided on the dicing film 11, and the dicing film 11 is mounted on the second flat ring 308. This second flat ring with the divided chips 41 proceeds to the post-process.

Thus, when the dicing film 11 is expanded, the wafer 10 is set to direct to the downward. Accordingly, the particle falls naturally, so that the particle is removed from the surface of the wafer 10. Thus, the particle is prevented from adhering on the wafer 10. Thus, the yielding ratio and the quality of the chips are improved.

Further, the particle is absorbed to the downside of the spacer 304 by the airflow generated by the air absorbing equipment. Thus, the particle is surely prevented from adhering on the wafer 10.

Further, the spacer 304 has the cylindrical shape and is movable up and down. Accordingly, the construction of the airflow generation device is simplified.

The holes 304a of the spacer 304 provides the airflow from the outside of the device 300 into the spacer 304 easily. Although the spacer 304 has the holes 304a, the spacer 304 may have grooves.

The grooves 302a of the mounting table 302 provides the airflow from the outside of the device 300 into the mounting table 302 easily.

Twelfth Embodiment

Figure 21:
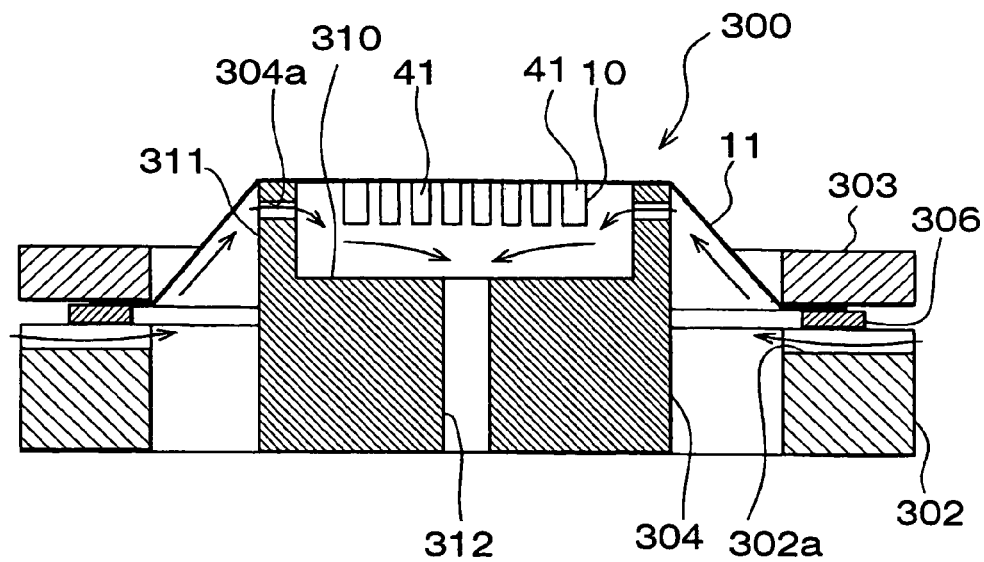
FIG. 21 is a cross sectional view showing another expand device, which corresponds to FIG. 18D.

FIG. 21 shows another expand device 300. The spacer 304 of the device 300 has a cylindrical column shape. Further, the spacer 304 has a concavity 310 disposed on the top surface of the spacer 304. The wafer 10 can be accommodated in the concavity 310 of the spacer 304. The sidewall 311 of the concavity 310 includes multiple holes 304a, which penetrates the sidewall 311. Thus, the air can flow from the outside of the spacer 304 to the inside of the spacer 304. An air passage 312 is formed on the center portion of the bottom of the concavity 310. The air passage 312 is disposed along with the center axis of the spacer 304.

In the above device 300, when the air absorbing device is operated, the air outside of the spacer 304 passes through the hole 304a of the spacer 304 so that the air is introduced into the concavity 310 of the spacer 304. Then, the airflows from the surface of the wafer 10 and the air passage 312 of the spacer 304 to the downside of the spacer 304.

Thirteenth Embodiment

Figure 22:
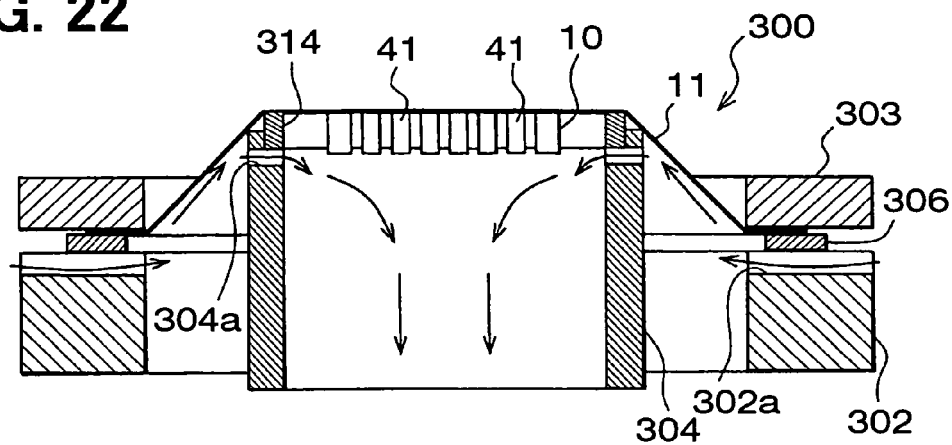
FIG. 22 is a cross sectional view showing further another expand device, which corresponds to FIG. 18D.
Figure 23:
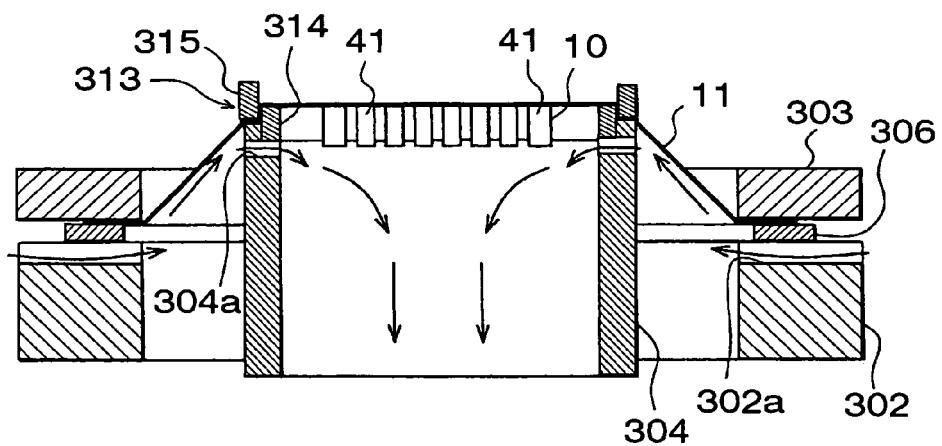
FIG. 23 is a cross sectional view explaining a step of mounting an outer ring on a dicing film.
Figure 24:
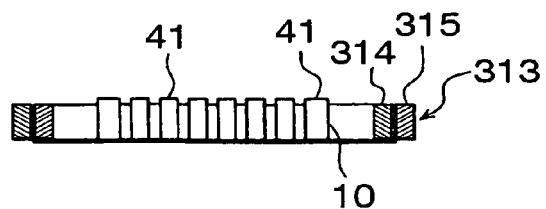
FIG. 24 is a cross sectional view showing the double ring frame with the dicing film.

FIGS. 22 to 24 show another expand device 300. The device 300 includes a double ring frame 313 having a ring shape. The dicing film 11 is mounted on the double ring frame 313. The double ring frame 313 includes an inner ring 314 and an outer ring 315.

Before the dicing film 11 is expanded, the inner ring 314 is attached on the top surface of the spacer 304. The inner ring 314 is removable from the spacer 304. As shown in FIG. 22, the spacer 304 is elevated so that the dicing film 11 is expanded. Thus, the wafer 10 is cut and separated. Then, as shown in FIG. 23, the outer ring 315 is inserted to the outside of the inner ring 314. The dicing film 11 is sandwiched between the inner ring 314 and the outer ring 315.

The part of the dicing film 11 outside of the outer ring 315 is cut, and the inner ring 314 is elevated so that the double ring frame 313 with the dicing film 11 is removed from the spacer 304. Thus, as shown in FIG. 24, the chips 41 are divided and disposed on the dicing film 11, which is fixed by the double ring frame 313.

Although the mounting table 302 includes the grooves 302a, and the spacer 304 includes the holes 304a, the mounting table 302 and the spacer 304 may not have a groove and a hole. For example, when the dicing film 11 has small through holes, no groove and no hole are necessitated in the table 302 and the spacer 304. Alternatively, the dicing film 11 may be made of porous material. In this case, the airflow can be generated from the outside of the device to the downside of the spacer 304 without forming the groove and the hole in the table 302 and the spacer 304. Further, the mounting table 302 and the spacer 304 may have another type of passage from the outside to the inside thereof.

The above disclosure has the following aspects.

According to a first aspect of the present disclosure, a device separated from a wafer includes: a chip having a sidewall, which is provided by a dicing surface of the wafer in a case where the device is separated from the wafer; and a protection member disposed on the sidewall of the chip for protecting the chip from being contaminated by a dust from the dicing surface. In this case, a particle is prevented from being removed from the dicing surface of the wafer. Here, when the chip is separated from the wafer, the dicing surface of the wafer is covered with the protection member so that the particle is prevented from being removed from the dicing surface of the wafer. Further, after the chip is separated from the wafer, the dicing surface of the wafer is covered with the protection member so that the particle is prevented from being removed from the dicing surface of the wafer. Thus, a yielding ratio and quality of the chip are improved.

Alternatively, the device may further include a reforming portion disposed on the sidewall. The reforming portion is covered with the protection member. There forming portion functions in such a manner that the wafer is cleaved from the reforming portion as a starting point when the device is separated from the wafer. The reforming portion is provided in the wafer before the device is separated from the wafer in such a manner that a laser beam is focused on a predetermined position in the wafer to provide the reforming portion around the predetermined position in the wafer by multiple photo absorption effect of the laser beam.

According to a second aspect of the present disclosure, a method for processing a wafer includes: dividing the wafer into multiple chips; and covering a sidewall of each chip with a protection member for protecting the chip from being contaminated by a dust from a dicing surface of the wafer. In this method, when the chip is separated from the wafer, the sidewall of the chip is covered with the protection member. Thus, a particle is prevented from being removed from the sidewall of the chip, which is the dicing surface of the wafer, when the chip is separated from the wafer or after the chip is separated from the wafer. Thus, a yielding ratio and quality of the chip are improved.

Alternatively, the method may further include: forming a reforming portion in the wafer along with a cutting line of the wafer in such a manner that a laser beam is focused on a predetermined position in the wafer to form the reforming portion around the predetermined position in the wafer by multiple photo absorption effect of the laser beam; and forming the protection member on a part of the wafer, which covers the cutting line. In the dividing the wafer, the wafer is cleaved from the reforming portion as a starting point so that the wafer is divided along with the cutting line. In the dividing the wafer, the protection member on the part of the wafer is melted. In the covering the sidewall of each chip, the melted protection member spreads on the dicing surface of the wafer so that the protection member covers the sidewall of the chip. Further, the method may further include forming a concavity on the part of the wafer, on which the protection member is formed. In the forming the protection member, the protection member is formed in the concavity so that the protection member is accommodated in the concavity. Further, the method may further include forming a groove on the wafer, the groove is in parallel to the part of the wafer, on which the protection member is formed. The groove is capable of accommodating the protection member when the melted protection member spreads on the wafer.

Alternatively, the protection member may have at least one of thermoplasticity, thermosetting property, photo hardening property, chemical reaction hardening property, and solvent evaporation hardening property.

Alternatively, the covering the sidewall of each chip may be performed after the dividing the wafer into multiple chips. Further, in the covering the sidewall of each chip, the chip may be inserted into a case made of the protection member so that the protection member adheres to the sidewall of the chip. Furthermore, the protection member may have at least one of heat shrinkage property, photo shrinkage property and elasticity.

Alternatively, in the dividing the wafer, a pressure may be applied to the protection member. Further, the method may further include: bonding a backside of the wafer to a dicing film; and mounting the wafer with the dicing film on a dicing stage. The dicing film has expansibility and air permeability. The dicing stage has air permeability. In the dividing the wafer, a tensile stress is applied to the wafer so that the wafer is cleaved from the reforming portion. In the dividing the wafer, a suction force is applied to the wafer through the dicing film along with the cutting line from the backside of the wafer.

According to a third aspect of the present disclosure, a semiconductor device includes: a dicing film; a semiconductor wafer disposed on the dicing film, wherein the wafer is capable of being divided into a plurality of chips along with a cutting line; a protection member disposed on a part of the wafer, which covers the cutting line of the wafer, wherein the part of the wafer is opposite to the dicing film; and a plurality of reforming portions disposed in the wafer, which is arranged along with the cutting line. In this case, a particle is prevented from being removed from the dicing surface of the wafer. Thus, a yielding ratio and quality of the chip are improved.

Alternatively, the wafer may be capable of being divided in such a manner that the wafer is cleaved from the reforming portion as a starting point. Alternatively, the protection member may be made of thermoplastic material, thermosetting material, photo hardening material, chemical reaction hardening material, solvent evaporation hardening material, heat shrinkage material, photo shrinkage material or elastic material. Alternatively, the reforming portions may provide a plurality of groups. One of the groups is disposed at a predetermined depth from the protection member, and another one of the groups is disposed at another predetermined depth from the protection member. Alternatively, the device may further include a concavity disposed on the part of the wafer, on which the protection member is disposed. The protection member is disposed in the concavity. Alternatively, the device may further include a pair of concavities disposed on another part of the wafer, which is in parallel to the cutting line. The protection member is sandwiched between a pair of the concavities.

Alternatively, the dicing film may include a first through hole, and the first through hole is disposed in a part of the dicing film, which corresponds to the wafer. Further, the first through hole may include a plurality of elongated holes, which are disconnected together, and each elongated hole is disposed along with a cutting line of the wafer. Alternatively, the dicing film may further include a second through hole, and the second through hole is disposed in another part of the dicing film, which corresponds to an outside of the wafer. Further, the second through hole may include a plurality of elongated holes, which are disconnected together, and each elongated hole is disposed along with a periphery of the wafer. Further, the first through hole may include a plurality of holes and the second through hole includes a plurality of holes so that the part and the another part of the dicing film provide a mesh structure. Further, the first through hole may include a plurality of holes so that the dicing film provides a mesh structure, and at least the part of the dicing film, which corresponds to the wafer, has the mesh structure. Furthermore, the mesh structure may include a radial line and a circumferential line, the radial line expands from a center of the dicing film in a radial pattern, and the circumferential line concentrically expands from the center of the dicing film.

According to a fourth aspect of the present disclosure, a dicing sheet includes: a dicing film capable of adhering to a plate object, which is to be separated into a plurality of chips, wherein the dicing film is capable of holding the chips thereon after the plate object is separated into the chips; and a first through hole disposed in a part of the dicing film, which corresponds to the plate object. In this case, even when a particle is generated from a dicing surface of the plate object, the particle is retrieved from the object through the first through hole. Thus, the particle is prevented from floating above the plate object, so that the particle is not scattered on the plate object. Thus, the yielding ratio and quality of the chips are improved.

Alternatively, the first through hole may include a plurality of elongated holes, which are disconnected together, and each elongated hole is disposed along with a cutting line of the plate object.

Alternatively, the sheet may further include a second through hole disposed in another part of the dicing film, which corresponds to an outside of the plate object. Further, the second through hole may include a plurality of elongated holes, which are disconnected together, and each elongated hole is disposed along with a periphery of the plate object.

Alternatively, the first through hole may include a plurality of holes so that the dicing film provides a mesh structure, and at least the part of the dicing film, which corresponds to the plate object, has the mesh structure. Further, the first through hole may include a plurality of holes and the second through hole may include a plurality of holes so that the part and the another part of the dicing film provide a mesh structure.

Furthermore, the mesh structure may be a square lattice structure. Alternatively, the mesh structure may include a radial line and a circumferential line. The radial line expands from a center of the dicing film in a radial pattern, and the circumferential line concentrically expands from the center of the dicing film.

According to a fifth aspect of the present disclosure, a method for dicing a wafer includes: bonding the dicing sheet on the plate object; irradiating a laser beam on the plate object along with a cutting line of the plate object so that a reforming portion is formed in the plate object by multiple photo absorption effect of the laser beam; cutting the plate object from the reforming portion as a starting point of cutting; and absorbing a particle generated from a cut surface of the plate object through the first through hole of the dicing film so that the particle is absorbed toward a backside of the dicing film, wherein the backside of the dicing film is opposite to the plate object. In this case, the particle is prevented from floating above the plate object, so that the particle is not scattered on the plate object. Thus, the yielding ratio and quality of the chips are improved.

According to a sixth aspect of the present disclosure, a method for dicing a wafer includes: bonding the dicing sheet on the plate object; irradiating a laser beam on the plate object along with a cutting line of the plate object so that are forming portion is formed in the plate object by multiple photo absorption effect of the laser beam; cutting the plate object from the reforming portion as a starting point of cutting; and absorbing a particle generated by irradiation of the laser beam in the irradiating the laser beam through the first and/or second through holes of the dicing film so that the particle is absorbed toward a backside of the dicing film, wherein the backside of the dicing film is opposite to the plate object. In this case, the particle is prevented from floating above the plate object, so that the particle is not scattered on the plate object. Thus, the yielding ratio and quality of the chips are improved.

According to a seventh aspect of the present disclosure, a dicing device for dividing a semiconductor substrate into a plurality of chips includes: a dicing film, on which the semiconductor substrate is disposed; a laser element for irradiating a laser beam on the semiconductor substrate in order to provide a reforming portion in the substrate; and an expand device for mounting the dicing film and for expanding the dicing film in order to dividing the substrate into the chips. The dicing film is mounted on the expand device in such a manner that the substrate on the dicing film is disposed downward in order to fall a particle downward freely, and the particle is derived from a dicing surface of the substrate.

In this device, the particle falls freely downwardly, so that the particle is removed from the surface of the substrate. Thus, the particle is prevented from adhering on the substrate. Accordingly, the yielding ratio and the quality of the chips are improved.

Alternatively, the expand device may include a spacer. The spacer is movable up and down so that the spacer pushes up a part of the dicing film in order to expand the dicing film, the part which is disposed around the substrate, and the spacer has a cylindrical shape. Further, the device may further include an airflow generation device for generating an airflow from a surface of the substrate to a downside of the spacer. Furthermore, the spacer may include a plurality of grooves or holes, which is disposed on a part of the spacer near the substrate.

Alternatively, the expand device may include a spacer. The spacer is movable up and down so that the spacer pushes up a part of the dicing film in order to expand the dicing film, the part which is disposed around the substrate, the spacer has a cylindrical columnar shape, and the spacer includes a concavity for surrounding the substrate. Further, the device may further include an airflow generation device for generating an airflow from a surface of the substrate to a downside of the spacer. Furthermore, the spacer further may include a plurality of grooves or holes, which is disposed on a part of the spacer near the substrate. The part of the spacer is a sidewall of the concavity of the spacer, the concavity of the spacer includes a bottom with an air passage, and the air passage is disposed on the bottom so that the air flows from the concavity to an outside of the spacer.

According to a eighth aspect of the present disclosure, a method for dicing a semiconductor substrate into a plurality of chips, includes: bonding a semiconductor substrate on a dicing film; irradiating a laser beam on the substrate in order to form a reforming portion in the substrate; and expanding the substrate through the dicing film in order to divide the substrate into the chips. In the expanding the substrate, the dicing film is mounted on an expand device in such a manner that the substrate on the dicing film is disposed downward in order to fall a particle downward freely, and the particle is derived from a dicing surface of the substrate.

In this method, the particle falls freely downwardly, so that the particle is removed from the surface of the substrate. Thus, the particle is prevented from adhering on the substrate. Accordingly, the yielding ratio and the quality of the chips are improved.

Alternatively, the method may further include: generating an airflow from a surface of the substrate to a downside of the spacer.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:
1. A method for processing a wafer comprising:
dividing the wafer into multiple chips; and covering a sidewall of each chip with a protection member for protecting the chip from being contaminated by a dust from a dicing surface of the wafer;
forming a reforming portion in the wafer along with a cutting line of the wafer in such a manner that a laser beam is focused on a predetermined position in the wafer to form the reforming portion around the predetermined position in the wafer by multiple photo absorption effect of the laser beam; and
forming the protection member on a part of the wafer, which covers the cutting line, wherein
in the dividing the wafer, the wafer is cleaved from the reforming portion as a starting point so that the wafer is divided along with the cutting line,
in the dividing the wafer, the protection member on the part of the wafer is melted, and
in the covering the sidewall of each chip, the melted protection member spreads on the dicing surface of the wafer so that the protection member covers the sidewall of the chip.
2. The method according to claim 1, further comprising forming a concavity on the part of the wafer, on which the protection member is formed, wherein in the forming of the protection member, the protection member is formed in the concavity so that the protection member is accommodated in the concavity.

3. The method according to claim 1, further comprising forming a groove on the wafer, wherein
the groove is in parallel to the part of the wafer, on which the protection member is formed, and
the groove is capable of accommodating the protection member when the melted protection member spreads on the wafer.

4. The method according to claim 1, wherein the wafer is a semiconductor wafer.

5. The method according to claim 1, wherein in the dividing the wafer, a pressure is applied to the protection member.

6. The method according to claim 1, further comprising:
bonding a backside of the wafer to a dicing film; and
mounting the wafer with the dicing film on a dicing stage, wherein
the dicing film has expansibility and air permeability,
the dicing stage has air permeability,
in the dividing of the wafer, a tensile stress is applied to the wafer so that the wafer is cleaved from the reforming portion, and
in the dividing of the wafer, a suction force is applied to the wafer through the dicing film along with the cutting line from the backside of the wafer.

7. A method for dicing a wafer comprising:
bonding a dicing film on the plate object, wherein
the dicing film is capable of adhering to the plate object, which is to be separated into a plurality of chips,
the dicing film is capable of holding the chips thereon after the plate object is separated into the chips; and
a first through hole is disposed in a part of the dicing film that corresponds to the plate object;
irradiating a laser beam on the plate object along with a cutting line of the plate object so that a reforming portion is formed in the plate object by multiple photo absorption effect of the laser beam;
cutting the plate object from the reforming portion as a starting point of cutting; and
discharging a particle generated from a cut surface of the plate object through the first through hole of the dicing film so that the particle is discharged toward a backside of the dicing film, wherein the backside of the dicing film faces away from the plate object.

8. A method for dicing a wafer comprising:
bonding a dicing film on a plate object, wherein
the dicing film is capable of adhering to the plate object, which is to be separated into a plurality of chips,
the dicing film is capable of holding the chips thereon after the plate object is separated into the chips;
a first through hole is disposed in a part of the dicing film that corresponds to the plate object; and
a second through hole disposed in another part of the dicing film that corresponds to an outside of the plate object;
irradiating a laser beam on the plate object along with a cutting line of the plate object so that a reforming portion is formed in the plate object by multiple photo absorption effect of the laser beam;
cutting the plate object from the reforming portion as a starting point of cutting; and
discharging a particle generated by irradiation of the laser beam in the irradiating the laser beam through the first and/or second through holes of the dicing film so that the particle is discharged toward a backside of the dicing film, wherein the backside of the dicing film faces away from the plate object.

9. The method according to claim 8, further comprising:
discharging another particle generated from a cut surface of the plate object through the first through hole of the dicing film so that the another particle is discharged toward the backside of the dicing film.

10. A method for dicing a semiconductor substrate into a plurality of chips, the method comprising:
bonding a semiconductor substrate on a dicing film;
irradiating a laser beam on the substrate in order to form a reforming portion in the substrate; and
expanding the substrate through the dicing film in order to divide the substrate into the chips, wherein
in the expanding the substrate, the dicing film is mounted on an expand device in such a manner that the substrate on the dicing film is disposed downward in order to cause a particle to fall downward freely,
the particle is derived from a dicing surface of the substrate,
the expand device includes a spacer, and the spacer is movable up and down so that the spacer pushes up a part of the dicing film in order to expand the dicing film,
the part of the dicing film is disposed around the substrate,
the spacer has a cylindrical columnar shape, and
the spacer includes a concavity for surrounding the substrate.

11. The method according to claim 10, further comprising generating an airflow from a surface of the substrate to a downside of the spacer.

12. The method according to claim 11, wherein
the spacer further includes a plurality of grooves or holes, which is disposed on a part of the spacer near the substrate,
the part of the spacer is a sidewall of the concavity of the spacer,
the concavity of the spacer includes a bottom with an air passage, and
the air passage is disposed on the bottom so that the air flows from the concavity to an outside of the spacer.

13. The device according to claim 11, wherein the dicing film is made of porous material.

14. The device according to claim 11, wherein the dicing film includes a plurality of through holes.

* * * * *